(12) United States Patent
Ogata

(10) Patent No.: US 8,779,593 B2
(45) Date of Patent: Jul. 15, 2014

(54) SEMICONDUCTOR INTEGRATED CIRCUIT DEVICE

(75) Inventor: Tamotsu Ogata, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 33 days.

(21) Appl. No.: 13/592,540

(22) Filed: Aug. 23, 2012

(65) Prior Publication Data

US 2013/0062777 A1 Mar. 14, 2013

(30) Foreign Application Priority Data

Sep. 8, 2011 (JP) ................. 2011-195707

(51) Int. Cl.
*H01L 29/40* (2006.01)
*H01L 23/52* (2006.01)
*H01L 23/48* (2006.01)

(52) U.S. Cl.
USPC ........... 257/758; 257/E23.153; 257/774; 438/118; 438/622

(58) Field of Classification Search
CPC .................................................. H01L 23/5329
USPC .......... 257/E23.011, E23.145, 690, 692, 737, 257/738, 758, 774, 778, 792, E23.153; 438/697, 633, 692, 693, 613, 614, 118, 438/622
See application file for complete search history.

(56) References Cited

U.S. PATENT DOCUMENTS

| | | | | |
|---|---|---|---|---|
| 6,022,797 | A * | 2/2000 | Ogasawara et al. | 438/622 |
| 6,184,143 | B1 * | 2/2001 | Ohashi et al. | 438/697 |
| 6,656,828 | B1 * | 12/2003 | Maitani et al. | 438/613 |
| 6,861,756 | B2 * | 3/2005 | Saito et al. | 257/762 |
| 2001/0005624 | A1 * | 6/2001 | Aoyagi et al. | 438/622 |
| 2003/0045088 | A1 * | 3/2003 | Imai et al. | 438/622 |
| 2004/0245622 | A1 * | 12/2004 | Shimanuki et al. | 257/690 |
| 2009/0017565 | A1 * | 1/2009 | Hasebe et al. | 438/17 |
| 2009/0102059 | A1 * | 4/2009 | Ishii | 257/774 |
| 2010/0330799 | A1 | 12/2010 | Hamanaka et al. | |
| 2011/0121375 | A1 | 5/2011 | Kawahara et al. | |

FOREIGN PATENT DOCUMENTS

| | | |
|---|---|---|
| JP | 2010-147267 A | 7/2010 |
| JP | 2011-9581 A | 1/2011 |
| JP | 2011-114049 A | 6/2011 |
| JP | 2011-129722 A | 6/2011 |

* cited by examiner

*Primary Examiner* — Chris Chu
(74) *Attorney, Agent, or Firm* — Miles & Stockbridge P.C.

(57) ABSTRACT

Also in a semiconductor integrated circuit device including a copper embedded wiring as a main wiring layer, generally, the uppermost-layer wiring layer is often an aluminum-based pad layer in order to ensure wire bonding characteristics. The aluminum-based pad layer is also generally used as a wiring layer (general intercoupling wiring such as power source wiring or signal wiring). However, such a general intercoupling wiring has a relatively large wiring length. This causes a demerit for the device to be susceptible to damages during a plasma treatment due to the antenna effect, and other demerits. With the present invention, in a semiconductor integrated circuit device including a metal multilayer wiring system having a lower-layer embedded type multilayer wiring layer and an upper-layer non-embedded type aluminum-based pad metal layer, the non-embedded type aluminum-based pad metal layer substantially does not have a power supply ring wiring.

14 Claims, 20 Drawing Sheets

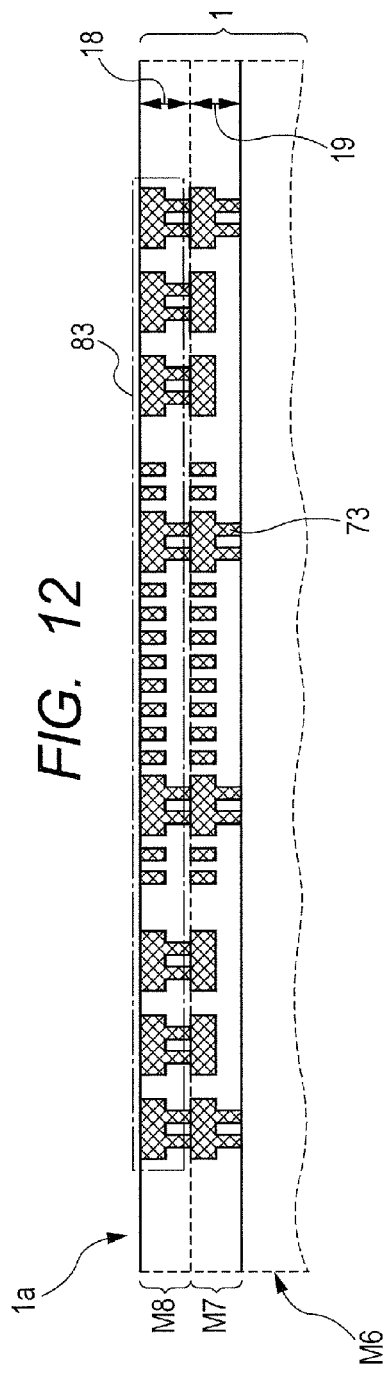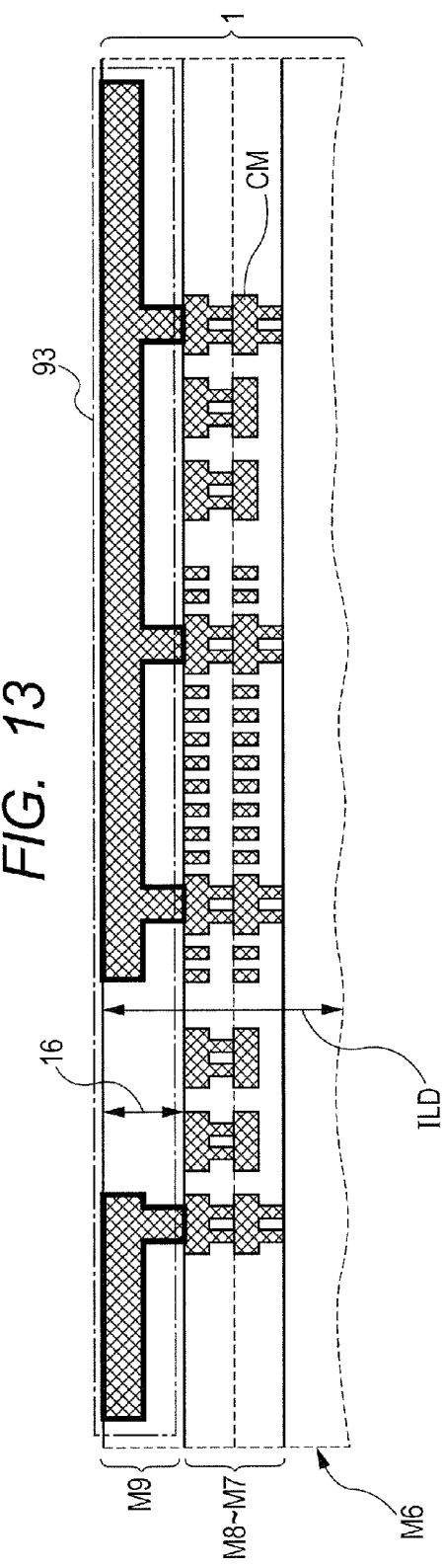

SEMICONDUCTOR INTEGRATED CIRCUIT DEVICE

CROSS-REFERENCE TO RELATED APPLICATIONS

The disclosure of Japanese Patent Application No. 2011-195707 filed on Sep. 8, 2011 including the specification, drawings and abstract is incorporated herein by reference in its entirety.

BACKGROUND

The present invention relates to a technology effectively applicable to a structural technology of wirings, bonding pads, and the like in a semiconductor integrated circuit device (or a semiconductor device).

In Japanese Unexamined Patent Publication No. 2011-114049 (Patent Document 1), there is disclosed a wiring layer configuration in which all the wiring layers except, for an aluminum-based pad layer are copper wirings in a memory type semiconductor integrated circuit device.

In Japanese Unexamined Patent Publication No.2011-129722 (Patent Document 2), there is disclosed a semiconductor integrated circuit device in which aluminum-based pads (including bonding pads and pads over a seal ring) are formed over a multilayer copper wiring.

In Japanese Unexamined Patent Publication No.2011-9581 (Patent Document 3) or its corresponding US Patent No. 2010-330799 A1 (Patent Document 4), there is disclosed a semiconductor integrated circuit device in which over the uppermost layer of copper embedded wirings, aluminum-based pads are formed without a relay metal member such as a tungsten plug interposed therebetween, and the bonding pads are coupled with bonding wires, respectively.

Japanese Unexamined Patent Publication No.2010-147267 (Patent Document 5) discloses the following: in a semiconductor integrated circuit device of a wafer level package system in which a rewiring is formed over an aluminum-based pad layer, the aluminum-based pad layer is used as the uppermost-layer metal wiring of copper damascene wirings, and furthermore, the same layer is used exclusively for pads.

PATENT DOCUMENTS

[Patent Document 1]
Japanese Unexamined Patent Publication No. 2011-114049
[Patent Document 2]
Japanese Unexamined Patent Publication No. 2011-129722
[Patent Document 3]
Japanese Unexamined Patent Publication. No. 2011-9581
[Patent Document 4]
US Patent No. 2010-330799 A1
[Patent Document 5]
Japanese Unexamined Patent Publication No. 2010-147267

SUMMARY

Also in a semiconductor integrated circuit device including a copper embedded wiring as a main wiring layer, generally, in order to ensure the wire bonding characteristics, the uppermost-layer wiring layer is often set to be an aluminum-based pad layer. The aluminum-based pad layer is also generally used as a wiring layer (a general intercoupling wiring such as a power source wiring or a signal wiring). However, such a general intercoupling wiring has a relatively large wiring length. This causes a demerit for the device to be susceptible to damages during a plasma treatment due to, the antenna effect, and other demerits. Further, also when the aluminum-based pad layer includes no such general intercoupling wirings, the presence of power supply trunk wirings such as power supply rings having a large width and dimensions comparable to the chip sizes, or the like unfavorably tends to cause the occurrence of cracks and the like due to the difference in physical properties between this and a final passivation film, or causes other problems.

The present invention was made in order to solve these problems.

It is an object of the present invention to provide a high-reliability semiconductor integrated circuit device.

The foregoing and other objects, and the novel features of the present invention will be apparent through the description in this specification and the accompanying drawings.

Summaries of the representative ones of the inventions disclosed in the present application will be described in brief as follows.

Namely, in accordance with one invention of the present application, in a semiconductor integrated circuit device including a metal multilayer wiring system having a lower-layer embedded type multilayer wiring layer and an upper-layer non-embedded type aluminum-based pad metal layer, the non-embedded type aluminum-based pad metal layer substantially does not have a power supply ring wiring.

Effects obtained by the representative ones of the inventions disclosed in the present application will be described in brief as follows.

Namely, in a semiconductor integrated circuit device including a metal multilayer wiring system having a lower-layer embedded type multilayer wiring layer and an upper-layer non-embedded type aluminum-based pad metal layer, the non-embedded type aluminum-based pad metal layer substantially does not have a power supply ring wiring. This can implement a high-reliability semiconductor integrated circuit device.

BRIEF DESCRIPTION OF THE DRAWINGS

FIG. 12 is a device schematic cross-sectional view corresponding to FIG. 8 for illustrating the wafer process and the like in the semiconductor integrated circuit device of the one embodiment of the present application (upon completion of an embedded type eighth wiring layer M8);

FIG. 13 is a device schematic cross-sectional view corresponding to FIG. 8 for illustrating the wafer process and the like in the semiconductor integrated circuit device of the one embodiment of the present application (upon completion of an embedded type uppermost-layer wiring layer M9);

DETAILED DESCRIPTION

Figure 1:
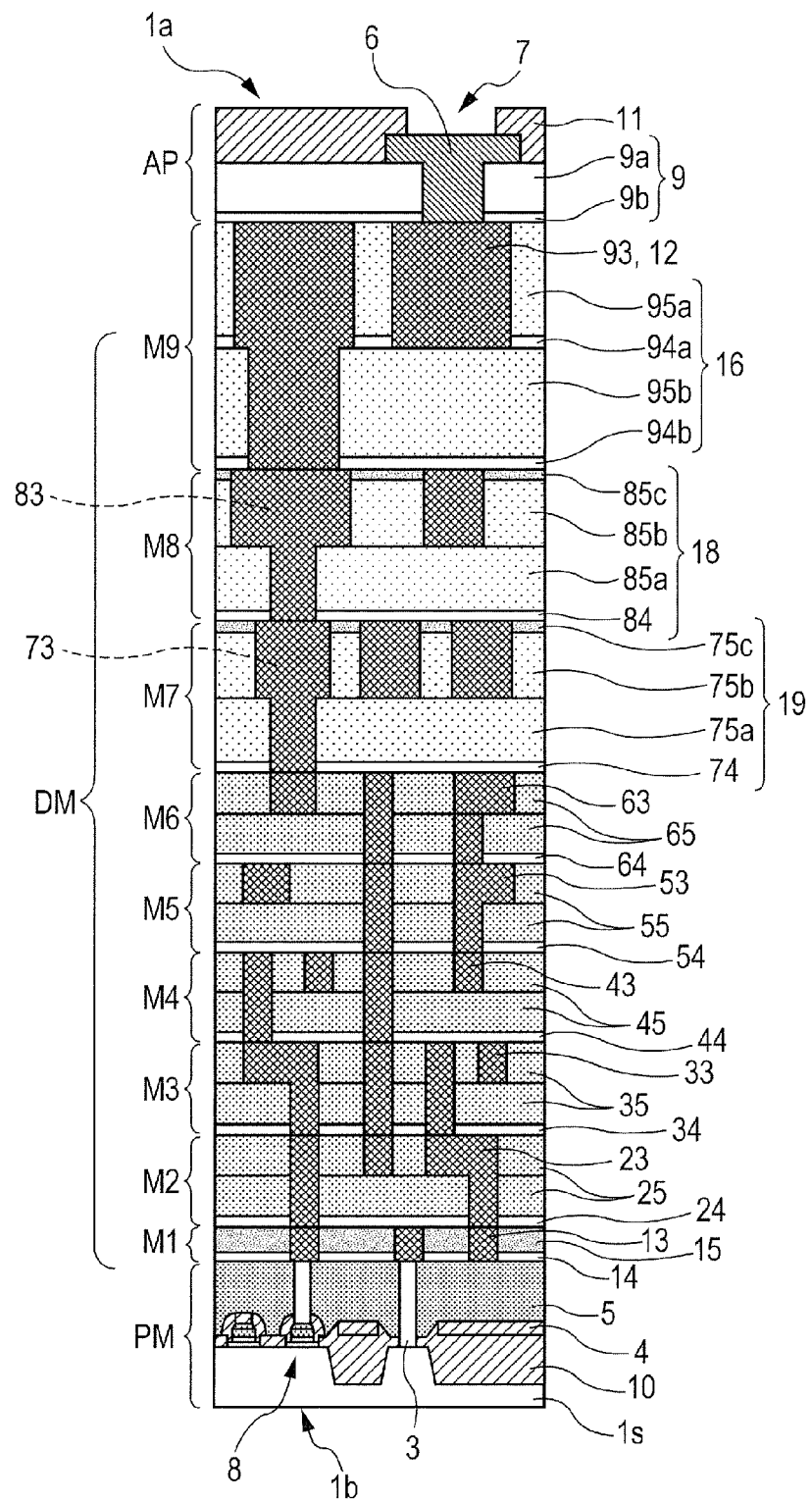
FIG. 1 is a device schematic cross-sectional view of a metal wiring system and the like for illustrating the outline of the metal wiring system and the like in a semiconductor integrated circuit device of one embodiment of the present application.

[Summary of Embodiments] First, a summary will be described regarding the representative embodiments of the inventions disclosed in the present application.

1. A semiconductor integrated circuit device includes: (a) a semiconductor substrate having a first main surface; (b) a plurality of MISFETs arranged over the first main surface of the semiconductor substrate; (c) an embedded type multilayer wiring layer arranged over the first main surface of the semiconductor substrate and over the MISFETs; (d) a non-embedded type aluminum-based pad metal layer arranged over the embedded type multilayer wiring layer; (e) a plurality of metal bonding pads arranged as parts of the non-embedded type aluminum-based pad metal layer; (f) a final passivation film formed at a layer above the non-embedded type aluminum-based pad metal layer; and (g) a pad opening arranged in the final passivation film over each of the metal bonding pads. The non-embedded type aluminum-based pad metal layer substantially does not have a power supply ring wiring.

2. The semiconductor integrated circuit device according to the item 1, further includes: (h) a power supply ring wiring arranged as a part of an embedded type uppermost-layer wiring layer of the embedded type multilayer wiring layer.

3. The semiconductor integrated circuit device according to the item 2, further includes: (i) a dishing preventing slit arranged in the power supply ring wiring.

4. In the semiconductor integrated circuit device according to the item 2 or 3, each of the metal bonding pads is coupled to the embedded type uppermost-layer wiring layer not via a plug.

5. The semiconductor integrated circuit device according to any one of the items 2 to 4, further includes: (j) an under-layer metal pad arranged as a part of the embedded type uppermost-layer wiring layer under each of the metal bonding pads, and nearly equal in shape and area to the metal bonding pad thereover.

6. The semiconductor integrated circuit device according to the item 5, further includes: (k) a single through hole arranged between each of the metal bonding pads and the underlayer metal pad thereunder.

7. The semiconductor integrated circuit device according to the item 5, further includes: (k) a plurality of through holes arranged between each of the metal bonding pads and the underlayer metal pad thereunder.

8. In the semiconductor integrated circuit device according to any one of the items 1 to 7, the non-embedded type aluminum-based pad metal layer substantially does not have a wiring.

9. The semiconductor integrated circuit device according to any one of the items 1 to 8, further includes: (m) a large number of occupancy ratio-regulating dummy patterns, arranged in such a manner as to be almost uniformly distributed as parts of the non-embedded type aluminum-based pad metal layer in the inside region of the first main surface.

10. The semiconductor integrated circuit device according to any one of the items 1 to 9, further includes: (n) an aluminum-based seal ring as a part of the non-embedded type aluminum-based pad metal layer along the periphery of the first main surface.

11. The semiconductor integrated circuit device according to any one of the items 1 to 10 further includes: (p) a bonding wire coupled to the top surface of each of the metal bonding pads.

12. The semiconductor integrated circuit device according to any one of the items 1 to 11 further includes: (q) a sealing resin layer covering over the final passivation film.

13. In the semiconductor integrated circuit device according to any one of the items 1 to 12, the non-embedded type aluminum-based pad metal layer substantially does not have a signal wiring.

14. In the semiconductor integrated circuit device according to any one of the items 10 to 13, the metal bonding pads are arrayed in a ring form so as to be along the aluminum-based seal ring and in the inside thereof.

15. In the semiconductor integrated circuit device according to any one of the items 1 to 14, the embedded type multilayer wiring layer is a copper-based embedded type multilayer wiring layer.

Explanation of Description Form, Basic Terms, and Methods in the Present Application 1. In the present application, in the following description of embodiments, the description may be divided into a plurality of sections for convenience, if required. However, unless otherwise specified, these are not independent of each other, but, are respective parts of a single example, in a relation such that one is a detailed explanation of a part of the other, a modification example of a part or the whole of the other, or the like. Further, in principle, the repetitive description of the same parts will be omitted. Whereas, respective constitutional elements in embodiments are not essential, unless otherwise specified, or except for the case where the number is theoretically limiting, and unless otherwise apparent from the context.

Further, in the present application, the term "semiconductor devices" or "semiconductor integrated circuit devices" mainly means various transistors (active elements) alone, and those prepared by, with these as the main parts, integrating resistors, capacitors, and the like over a semiconductor chip or the like (e.g., a single crystal silicon substrate). Herein, representative examples of various transistors may include MISFETs (Metal Insulator Semiconductor Field Effect Transistors) typified by MOSFETs (Metal Oxide Semiconductor Field Effect Transistors). In this case, representative examples of the integrated circuit configuration may include a CMIS (Complementary Metal Insulator Semiconductor) type integrated circuit typified by a CMOS (Complementary Metal Oxide Semiconductor) type integrated circuit including an N channel type MISFET and a P channel type MISFET in combination.

The wafer steps of current-day semiconductor integrated circuit devices, namely, LSI (Large Scale Integration) can be generally largely classified into FEOL (Front End of Line) steps of from transfer-in of a silicon wafer as a raw material roughly up to a premetal step (step including formation of an interlayer insulation film or the like between the M1 wiring layer bottom end and the gate electrode structure, formation of contact holes, tungsten plug embedding, and the like), and BEOL (Back End of Line) steps starting from the M1 wiring layer formation roughly up to formation of pad openings into a final passivation film over aluminum-based pad electrodes (in a wafer level package process, the process being also included).

2. Similarly, in the description of embodiments, and the like, the term "X including A" or the like for the material, composition, or the like does not exclude the one including an element other than A as one of main constitutional elements unless otherwise specified and unless otherwise apparent from the context. For example, for the component, the term is used to embrace "X including A as a main component", and the like. For example, it is naturally understood that the term "silicon member" or the like herein used is not limited to pure silicon, but also embraces a SiGe alloy, other multinary alloys containing silicon as a main component, and other members containing additives, and the like. Similarly, it is naturally understood that the terms "silicon oxide film", "silicon oxide type insulation film", and the like are used to embrace thermal oxide films and CVD oxide films of not only relatively pure undoped silicon dioxide, but also FSG (Fluorosilicate Glass), TEOS-based silicon oxide, SiOC (Silicon Oxicarbide) or Carbon-doped Silicon oxide or OSG (Organosilicate glass), PSG (Phosphorus Silicate Glass), BPSG (Borophosphosilicate Glass), and the like; silica type Low-k insulation films (porous type insulation films) obtained by introducing voids into coating type silicon oxides such as SOG (Spin On Glass), and Nano-Clustering Silica: NSC, and the same members as these, composite films with other silicon type insulation films containing these as main constitutional elements, and the like.

Whereas, the silicon type insulation films commonly used in the semiconductor field as with silicon oxide type insulation films include silicon nitride type insulation films. Materials belonging to the system are SiN, SiCN, SiNH, SiCNH, and the like. The term "silicon nitride" as used herein includes both of SiN and SiNH unless otherwise specified. Likewise, the term "SiCN" as used herein means both of SiCN and SiCNH unless otherwise specified.

Incidentally, SiC has a property similar to that of SiN. However, SiON should often rather be classified into a silicon oxide type insulation film.

A silicon nitride film is often used as an etch stop film, namely, a CESL (Contact Etch-Stop Layer) in a SAC (Self-Aligned Contact) technology, and furthermore, is also used as a stress imparting film in a SMT (Stress Memorization Technique).

3. Similarly, preferred examples will be described regarding figures, positions, attributes, and the like. However, it is naturally understood that the present invention is not strictly limited thereto unless otherwise specified and unless otherwise apparent from the context.

4. Further, also when specific numerical values and quantities are mentioned, unless otherwise specified, except when they are theoretically limited to the numbers, and unless otherwise apparent from the context, each numerical value may be a numerical value of more than the specific numerical value, or may be a numerical value of less than the specific numerical value.

5. The term "wafer" herein used generally denotes a single crystal silicon wafer for forming a semiconductor integrated circuit device (or a semiconductor device or an electronic device) thereover. However, it is naturally understood that the term "wafer" also embraces a composite wafer or the like of an insulating substrate such as an epitaxial wafer, a SOI substrate, or a LCD glass substrate and a semiconductor layer or the like.

6. In the present application, the term "ring" mainly denotes a generally rectangular ring-shaped figure. However, "ring-shape" is not necessarily required to be closed. Specifically, there are a seal ring, a power supply ring, a pad ring, a through hole ring, and the like. The seal ring is generally a closed ring. Whereas, the power supply ring is apparently a nearly closed ring (which may be a strictly flat ring), but, to be exact, is often a partially opening open ring. The pad ring, the through hole ring, or the like is an array of dot-like pattern groups in a ring as a whole.

Incidentally, in the present application, the term "bonding pads" is intended to also embrace, other than the pads for wire bonding, those for forming bump electrodes and rewiring thereover.

7. In the present application, the "metal patterns" are, classified into a "wiring pattern" and a "non-wiring pattern". The "wiring pattern" or the "wiring" is a metal current path for establishing an intercoupling between a terminal (or an element) and an element, and has a main object of mainly passing a current therethrough. The "non-wiring patterns" include an element pattern, a pad pattern, a test pattern, an alignment pattern, a dummy pattern, and the like. The "wirings" are classified into "power source wirings" including power supply trunk wirings such as power supply rings (grounding ring and Vdd ring) and others, and "signal wirings". Alternatively, from the viewpoint of the geometrical uses, the following classification is also used. Namely, the "wirings" are classified into "semi-global wirings" mainly used for intercoupling between circuit modules and the like (in the following embodiments, for example, embedded type seventh and eighth wiring layers), "global wirings" used for wider-range coupling and the like (in the following embodiments, for example, an embedded type uppermost-layer wiring layer), "local wirings" mainly used for intercoupling in the circuit module (in the following embodiment, for example, an embedded type first wiring layer to an embedded type sixth wiring layer), and the like.

[Details of Embodiments] The embodiments will be further described in details. In respective figures, the same or similar portions are indicated with the same or similar signs or reference numbers. The description thereon is not repeated in principle.

Further, in the accompanying drawings, hatching or the like may be omitted even in cross section when it rather complicates the drawing, or when it is apparently distinct from the gap. In conjunction with this, when apparent from the description or the like, even for a two-dimensionally closed hole, the background outline may be omitted. Further, even not in cross section, hatching may be added in order to clearly demonstrate that the part is not a gap.

1. Explanation of outline of metal wiring system and the like in the semiconductor integrated circuit device of one embodiment of the present application (mainly FIGS. 1 and 2)

In this section, the structure of the semiconductor integrated circuit device of one embodiment of the present application will be summarized from the whole metal wiring system.

Below, a specific description will be given by taking a 65-nm technology node device as an example. However, the following examples are not limited thereto. It is naturally understood that the following examples are also applicable to devices of technology nodes finer than this, and are also applicable to devices of technology nodes not finer than this.

Further, below, a specific description will be given by taking a metal wiring system of 9 layers of embedded type wiring and one layer of an aluminum-based non-embedded wiring (metal layer) as an example. However, it is naturally understood that wiring systems of other numbers of layers are also acceptable.

Figure 2:
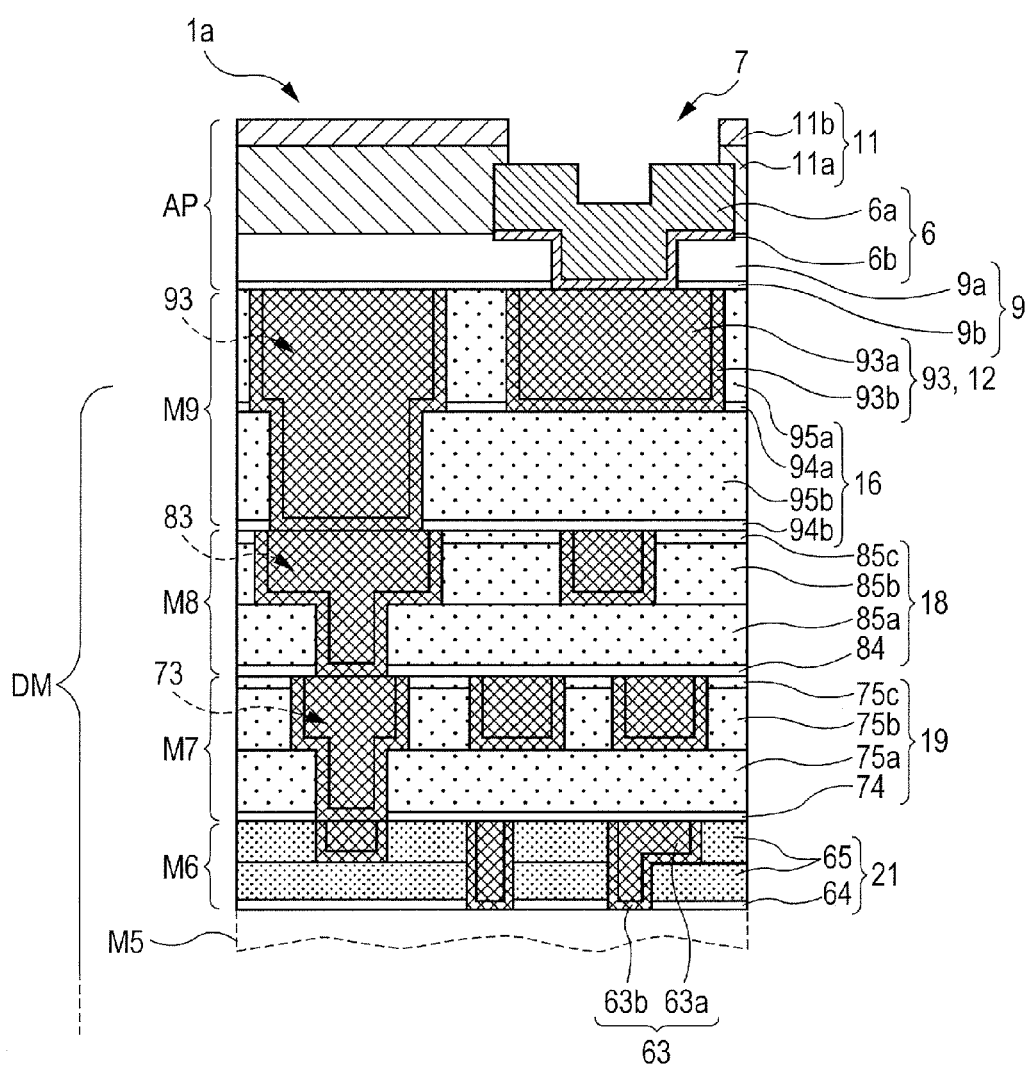
FIG. 2 is a more detailed device schematic cross-sectional view of from the chip surface to an embedded type sixth wiring layer M6 of FIG. 1.

FIG. 1 is a device schematic cross-sectional view of a metal wiring system and the like for illustrating the outline of the metal wiring system and the like in a semiconductor integrated circuit device of one embodiment of the present application. FIG. 2 is a more detailed device schematic cross-sectional view of from the chip surface to an embedded type sixth wiring layer M6 of FIG. 1. Based on these, a description will be given to the outline of the metal wiring system and the like in the semiconductor integrated circuit device of the one embodiment of the present application.

As shown in FIG. 1, for example, over a device surface 1a (a surface on the opposite side to a back surface 1b) of a P type single crystal silicon substrate is separated by a STI (Shallow Trench Isolation) type element isolation field insulation film 10, there is formed a gate electrode 8 of a P channel MOSFET or an N channel MOSFET. Thereover, there is formed a silicon nitride liner film 4 (e.g., about 30 nm) which is an etch stop film. Thereover, for example, there is formed a premetal interlayer insulation film 5 much thicker than the silicon nitride liner film 4, and including a lower-layer ozone TEOS silicon oxide film (e.g., about 200 nm) by a thermal CVD method, an upper-layer plasma TEOS silicon oxide film (e.g., about 270 nm), and the like. Further, there is formed a tungsten plug 3 penetrating through the premetal insulation film. The part described up to this point is a premetal region PM.

A first wiring layer M1 thereover includes a lower-layer insulation barrier film 14 such as a SiC film (e.g., about 50 nm), a plasma silicon oxide film 15 (e.g., about 150 nm) which is a main interlayer insulation film, and the like, and a copper wiring 13 embedded in a wiring trench formed therein, and the like.

Second to sixth wiring layers M2, M3, M4, M5, and M6 thereover have mutually almost the same structure. Respective layers each include, for example, their corresponding lower-layer insulation barrier films (liner films) 24, 34, 44, 54, and 64 formed of a SiC film (e.g., about 50 nm) or the like, and their corresponding main interlayer insulation films 25, 35, 45, 55, and 65 occupying the most region of the upper layer. The main interlayer insulation films 25, 35, 45, 55, and 65 are each formed of, for example, a carbon-doped silicon oxide film, i.e., a SiOC film (e.g., about 400 nm). Copper embedded wirings 23, 33, 43, 53, and 63 (e.g., about 150 nm in wiring width, about 200 nm in wiring thickness) including copper plugs and copper wirings are formed through the interlayer insulation films. Incidentally, the first wiring layer to the sixth wiring layer M1, M2, M3, M4, M5, and M6 are, for example, local wirings in this example.

A seventh wiring layer M7 and an eighth wiring layer M8 thereover have mutually almost the same structure. Respective interlayer insulation films, i.e., a semi-global lower-layer wiring layer interlayer insulation film 19 and a semi-global upper-layer wiring layer interlayer insulation film 18 include, for example, lowermost-layer insulation barrier films 74 and 84 each such as a SiC film (e.g., about 70 nm), intermediate-lower-layer plasma TEOS silicon oxide films. 75a and 85a (e.g., about 250 nm), intermediate-upper-layer FSG films 75b and 85b (e.g., about 250 nm), and plasma TEOS silicon oxide films 75c and 85c (e.g., about 100 nm) which are cap films, respectively. Copper embedded wirings 73 and 83 (e.g., about 200 nm in wiring width, about 350 nm in wiring thickness) including copper plugs and copper wirings are formed through the interlayer insulation films. Incidentally, in this example, the semi-global wiring includes two layers. However, the number of layers of the semi-global wiring can be set to be 3 or more, or can be set to be 1, if required.

A ninth wiring layer M9 thereover is, for example, a global wiring layer in this example, and has, for example, the following structure. An embedded wiring uppermost-layer interlayer insulation film 16 (global wiring layer interlayer insulation film) includes a lower-layer insulation barrier film 94b such as a SiC film (e.g., about 70 nm), an intermediate-lower-layer plasma TEOS type main interlayer insulation film 95b (e.g., about 800 nm), an intermediate-upper-layer SiN type insulation barrier film 94a, a plasma TEOS type main interlayer insulation film 95a (e.g., about 900 nm), and the like. Copper embedded wiring 93 (e.g., about 400 nm in wiring width, about 900 nm in wiring thickness) including copper plugs and copper wirings are formed through the interlayer insulation films, and the like. The part described up to this point is an embedded type multilayer wiring layer DW.

The insulation film structure of a non-embedded type aluminum-based pad metal layer AP thereover includes, for example, a lower-layer pad layer interlayer insulation film 9 and an upper-layer final passivation film, between which an aluminum-based bonding pad 6 is formed. Namely, the pad layer interlayer insulation film 9 includes a lower-layer insulation barrier film such as a SiN film 9b (e.g., about 100 nm), a plasma TEOS type main interlayer insulation film 9a (e.g., about 900 nm), and the like. Further, over the aluminum-based bonding pad 6, a pad opening 7 is arranged. Incidentally, the copper embedded wiring 93 under the aluminum-based bonding pad 6 is also an underlayer metal pad 12 as described above.

Then, referring to FIG. 2, a description will be given to the details of the cross-sectional structure of the embedded type sixth wiring layer M6 and the part thereover of FIG. 1. As shown in FIG. 2, the interlayer insulation film of the embedded type sixth wiring layer M6, i.e., a local uppermost-layer wiring layer interlayer insulation film 21 includes, for example, a lower-layer SiC type insulation barrier film 64 and an upper-layer SiOC type main interlayer insulation film 65. A copper embedded wiring 63 embedded therein includes, for example, an embedded type sixth wiring layer copper-based metal film 63a occupying the major part, and a tantalum nitride type barrier metal film 63b in the periphery (side surface and bottom surface) thereof. Incidentally, the detailed structures of the seventh-layer copper embedded wiring 73 and the eighth-layer copper embedded wiring 83 are also almost the same as that of the copper embedded wiring 63. Therefore, a description thereon will not be repeated. Further, the structures of the embedded type seventh wiring layer M7 and the embedded type eighth wiring layer M8 are also the same as those previously described for FIG. 1. Therefore, a description thereon will not be repeated herein.

Then, a description will be given to the embedded type ninth wiring layer M9 (embedded type uppermost-layer wiring layer). However, the structure of the embedded wiring uppermost-layer interlayer insulation film 16 (global wiring layer interlayer insulation film) is the same as that previously described for FIG. 1. Therefore, a description thereon will not be repeated herein, and a description will be given to the detailed structure of the uppermost-layer copper embedded wiring and the like 93 (such as wirings and vias). This structure is also the same as that previously described for FIG. 1, and includes, for example, the embedded type ninth wiring layer copper-based metal film 93a occupying the main part, and the tantalum nitride type barrier metal film 93b in the periphery (side surface and bottom surface) thereof.

Then, a description will be given to the non-embedded type aluminum-based pad metal layer AP. The interlayer insulation film of the non-embedded type aluminum-based pad metal layer AP includes, for example, the lower-layer pad layer interlayer insulation film 9 and the upper-layer final passivation film 11. The pad layer interlayer insulation film 9 includes, for example, the lower-layer SiN type insulation barrier film 9b (e.g., about 100 nm in thickness) and the upper-layer plasma TEOS type main interlayer insulation film 9a (e.g., about 600 nm in thickness). The upper-layer final passivation film 11 includes, for example, a lower-layer USG (Undoped Silicon Glass) type final passivation film 11a (e.g., about 900 nm in thickness) and an upper-layer plasma SiN type final passivation film 11b (e.g., about 600 nm in thickness). Between these, there are formed, for example, a lower-layer titanium nitride type pad barrier metal film 6b (e.g., about 100 nm in thickness) and an aluminum-based main bonding pad film 6a (e.g., about 100 nm in thickness).

2. Explanation of layout and the like over chip (or the periphery of chip region over wafer) in the semiconductor integrated circuit device of the one embodiment of the present application (mainly FIGS. 3 to 7)

In this section, the structure and the like of the semiconductor integrated circuit device of the one embodiment of the present application will be described with emphasis on the planar layout and the like of the non-embedded type aluminum-based pad metal layer and the embedded type ninth wiring layer (embedded type uppermost-layer wiring layer).

Incidentally, in this section, for convenience, a chip region 2 and the periphery thereof of a wafer 1 (e.g., FIG. 3) will be described. However, in the chip 2 separated as a final product, a dicing region 27 (scribe region) is no longer present as a result of processing by a dicing blade or the like.

Incidentally, herein, a specific description will be given by taking those with a chip size of about 10 millimeter square.

Figure 3:
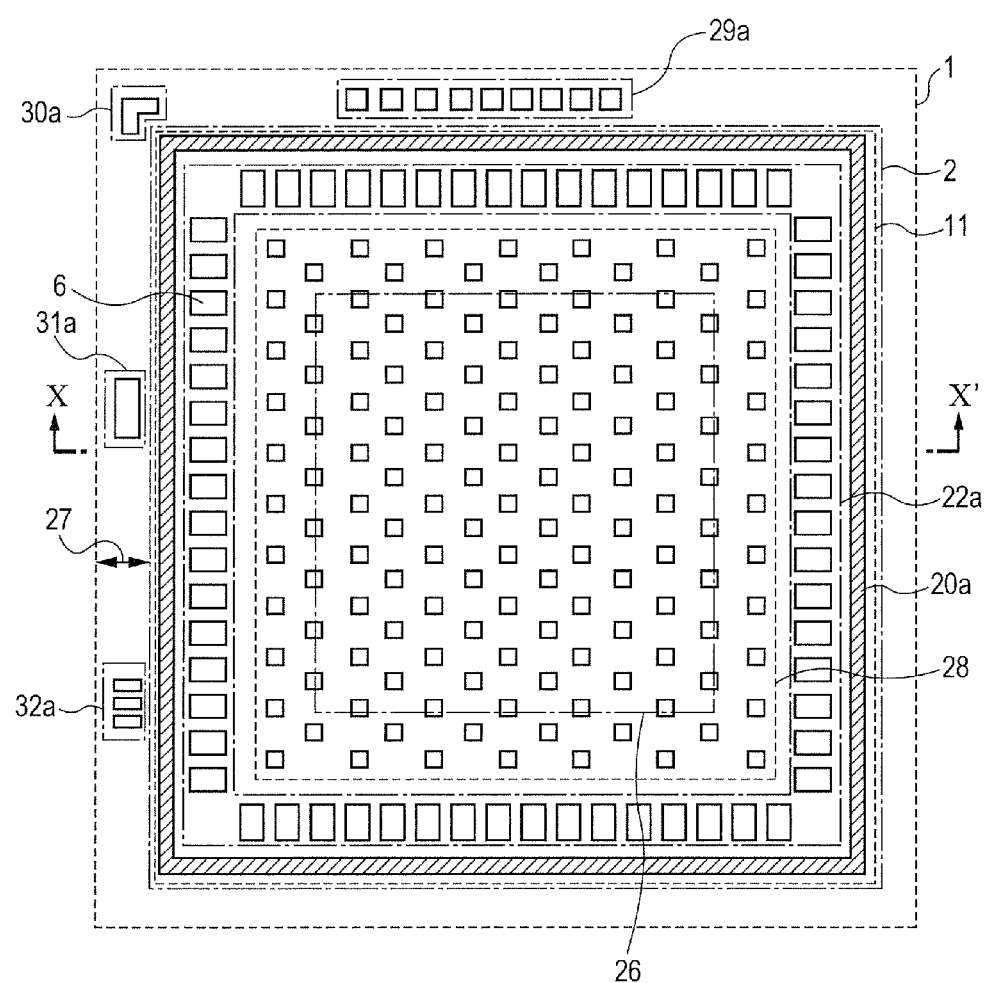
FIG. 3 is a schematic layout view of a chip region and its periphery for illustrating the layout and the like over a chip (or the periphery of the chip region over a wafer) in the semiconductor integrated circuit device of the one embodiment of the present application (shown with emphasis on a non-embedded type aluminum-based pad metal layer)
Figure 4:
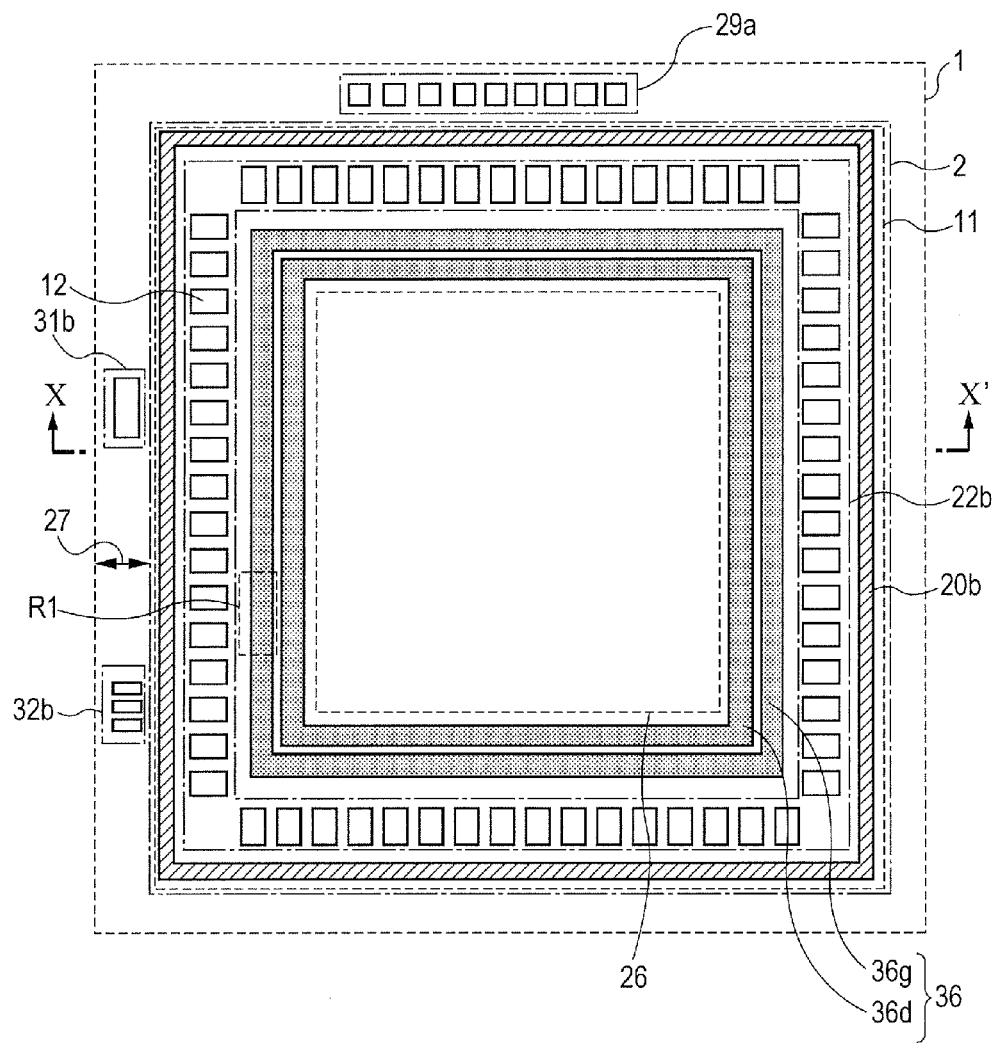
FIG. 4 is a schematic layout view of the chip region and its periphery for illustrating the layout and the like over the chip (or the periphery of the chip region over the wafer) in the semiconductor integrated circuit device of the one embodiment of the present application (shown with emphasis on an embedded type uppermost-layer wiring layer)
Figure 5:
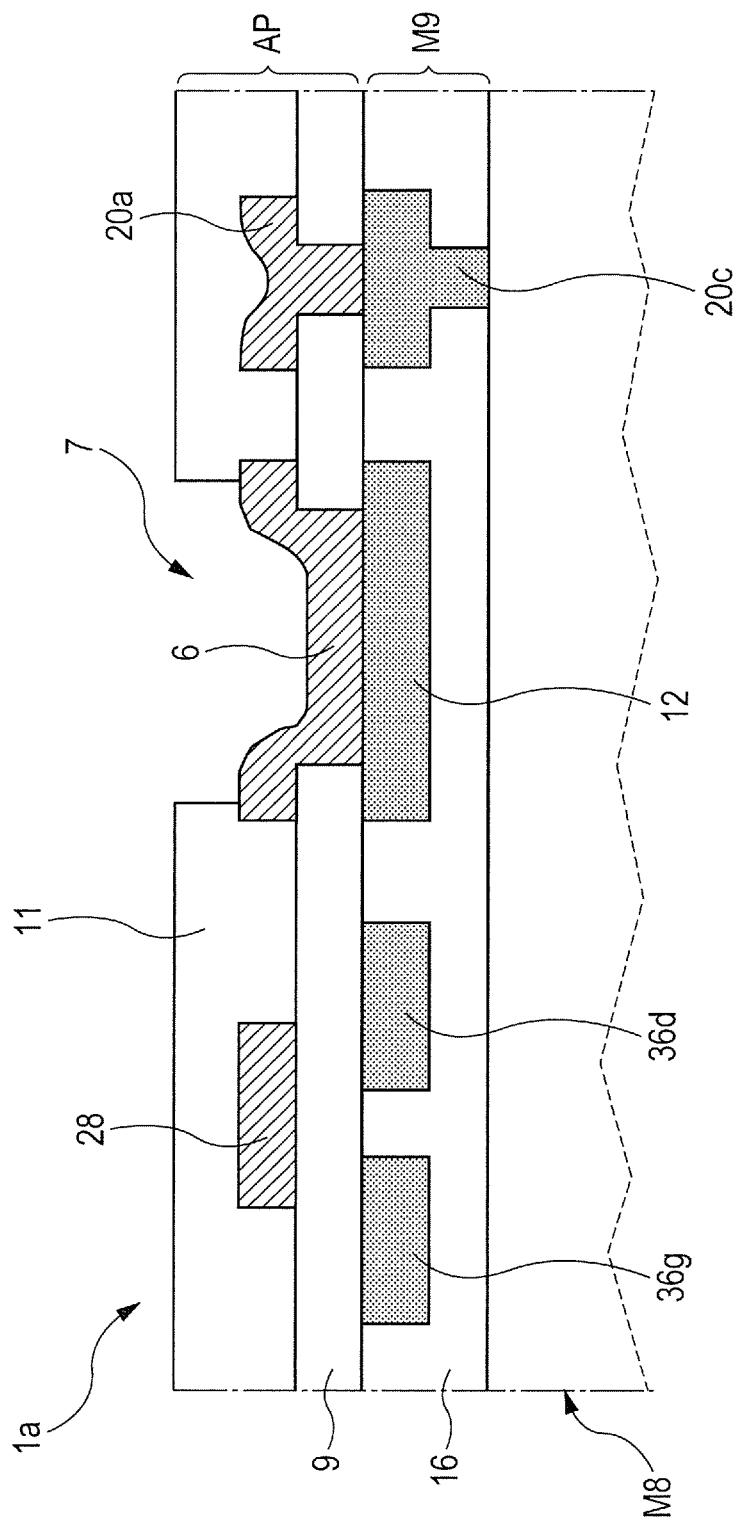
FIG. 5 is a device schematic cross-sectional view of the chip (the chip region and its periphery over the wafer) corresponding to the solid-line portion of the X-X' cross section of FIGS. 3 and 4.
Figure 6:
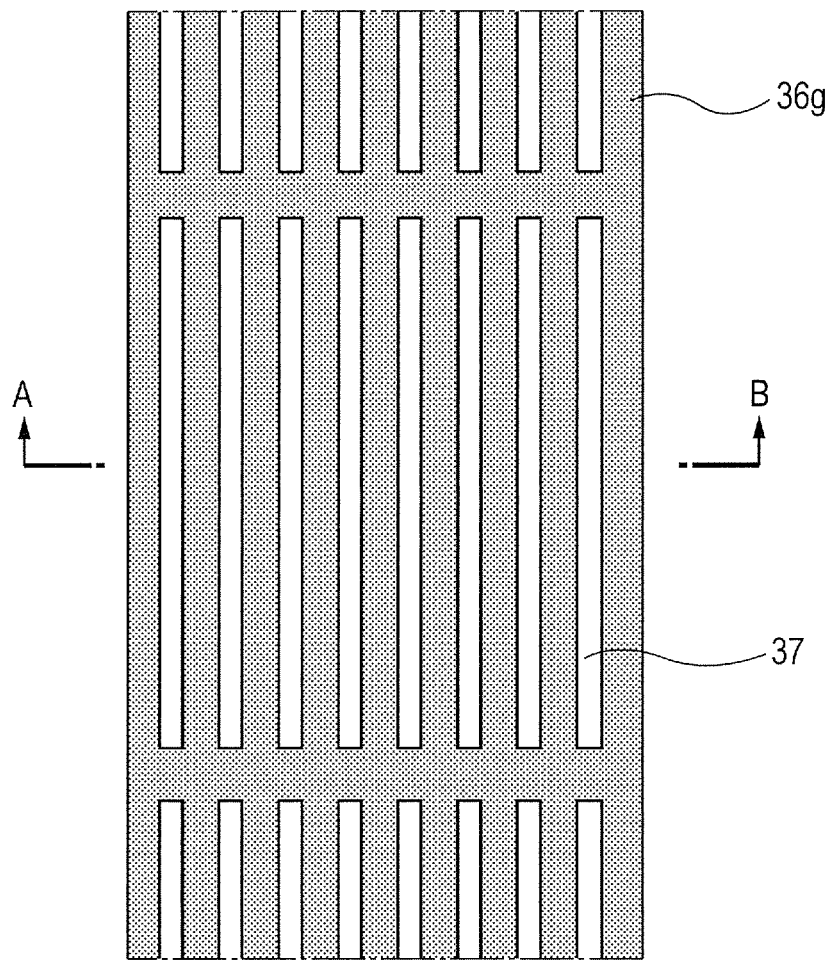
FIG. 6 is a detailed layout view of a power supply ring of a Vss ring cut-out region R1 of FIG. 4.
Figure 7:
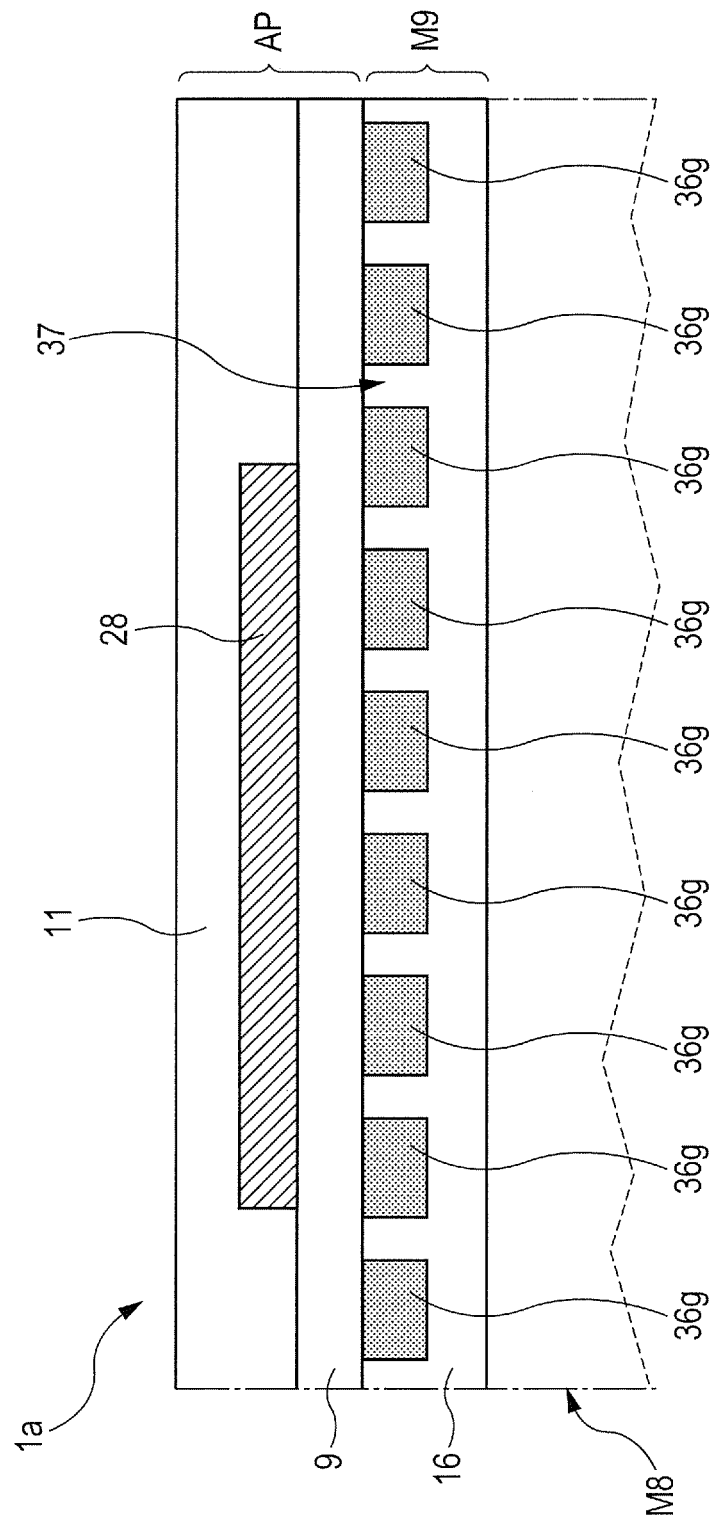
FIG. 7 is a device schematic cross-sectional view of the A-B cross section of FIG. 6.

FIG. 3 is a schematic layout view of a chip region and its periphery for illustrating the layout and the like over a chip (or the periphery of the chip region over a wafer) in the semiconductor integrated circuit device of the one embodiment of the present application (shown with emphasis on a non-embedded type aluminum-based pad metal layer). FIG. 4 is a schematic layout view of the chip region and its periphery for illustrating the layout and the like over the chip (or the periphery of the chip region over the wafer) in the semiconductor integrated circuit device of the one embodiment of the present application (shown with emphasis on an embedded type uppermost-layer wiring layer). FIG. 5 is a device schematic cross-sectional view of the chip (the chip region and it periphery over the wafer) corresponding to the solid-line portion of the X-X' cross section of FIGS. 3 and 4. FIG. 6 is a detailed layout view of a power supply ring of a Vss ring cut-out region R1 of FIG. 4. FIG. 7 is a device schematic cross-sectional view of the A-B cross section of FIG. 6. Based on these, a description will be given to the layout and the like over the chip (or the periphery of the chip region over the wafer) in the semiconductor integrated circuit device of the one embodiment of the present application.

First, the planar layout of the non-embedded type aluminum-based pad metal layer AP will be described by reference to FIG. 3. As shown in FIG. 3, as the patterns formed of the non-embedded type aluminum-based pad metal layer AP, in the outside of the chip region 2, there are, for example, an aluminum-based TEG pattern 29a, an aluminum-based laser trimming alignment reference pattern 30a, an aluminum-based film thickness monitor 31a, and an aluminum-based exposure alignment pattern 32a. On the other hand, in the inside of the chip region 2, there are, from the outer side, for example, an aluminum-based seal ring 20a for ensuring the moisture resistance and the strength, an aluminum-based pad ring 22a including a large number of bonding pads 6, and an occupancy ratio-regulating dummy pattern 28 (a dummy pattern for ensuring the dry etching characteristics for the non-embedded type aluminum-based pad metal layer AP) formed of repeating patterns spread over the entire inner surface of the aluminum-based pad ring 22a, and the like. Herein, the occupancy ratio-regulating dummy pattern 28 is desirably floating for avoiding plasma damages and the like, but is not required to be floating when there is no such a problem.

Further, the presence of the aluminum-based seal ring 20a is effective for inhibiting the propagation of cracking or the like from the chip periphery.

Herein, the total planar size of the aluminum-based TEG pattern 29a is, for example, about 50×2000 micrometers. Whereas, each size of the aluminum-based laser trimming alignment reference pattern 30a, the aluminum-based film thickness monitor 31a, and the aluminum-based exposure alignment pattern 32a is, for example, about 50×100 micrometers. Further, the width of the aluminum-based seal ring 20a is, for example, about 10 micrometers. The size of the bonding pad 6 is, for example, about 60×100 micrometers. Whereas, the size of each individual element pattern forming the occupancy ratio-regulating dummy pattern 28 is, for example, about 35 micrometer square. As the array pitch, for example, about 140 micrometers can be exemplified as a preferable one. Herein, the rectangular bonding pads 6 were specifically shown. However, the planar shape of the bonding pad 6 is not limited to a rectangular shape, but may be another figure such as a square (the dimensions are, for example, about 60×60 micrometers).

Incidentally, the central part of the region in which the occupancy ratio-regulating dummy pattern 28 is formed generally coincides with a chip inside circuit formation region 26. Further, almost the whole of the chip region is covered except for the outer end and the main part of each bonding pad 6 with the final passivation film 11 (e.g., an inorganic type final passivation film, or an organic type final passivation film such as a polyimide film, or both of these).

Then, the planar layout of the embedded type ninth wiring layer M9 (embedded type uppermost-layer wiring layer) will be described by reference to FIG. 4. As shown in FIG. 4, as patterns formed of the embedded type uppermost-layer wiring layer M9, in the outside of the chip region 2, there are, for example, a copper-based TEG pattern 29b, a copper-based film thickness monitor 31b, and a copper-based exposure alignment pattern 32b. On the other hand, in the inside of the chip region 2, there are, from the outer side, for example, a copper-based seal ring 20b for ensuring the moisture resistance and the strength, a copper-based pad ring 22b including a large number of underlayer metal pads 12, and a power supply ring 36 (power supply trunk wirings) including a Vss ring (grounding ring 36g) formed of a nearly ring-shaped grounding trunk wiring, and a Vdd ring (power supply ring 36d) formed of a nearly ring-shaped power supply trunk wiring. The inner side of the power supply ring 36 is generally the chip inside circuit formation region 26. Incidentally, in the case of a plurality of voltage sources, the number of power supply rings becomes plural according to the type of the power source.

Then, the structure of the X-X' cross section (solid line part) of FIGS. 3 and 4 (mainly, the non-embedded type aluminum-based pad metal layer AP and the embedded type uppermost-layer wiring layer M9) will be described by reference to FIG. 5. As shown in FIG. 5, over the embedded type eighth wiring layer M8, there is formed the embedded type uppermost-layer wiring layer M9. The embedded type uppermost-layer wiring layer M9 includes an embedded wiring uppermost-layer interlayer insulation film 16 (global wiring layer interlayer insulation film), and copper-based wirings, and the like embedded therein by a dual damascene method or the like. The copper-based wirings and the like of this layer include, for example, other than the Vss ring 36g (grounding ring) and the Vdd ring 36d (power supply ring), an underlayer metal pad 12 immediately under each aluminum-based bonding pad 6, in contact with this, and having almost the same shape, position, and size as those of this, and a copper-based seal ring 20c immediately under the aluminum-based seal ring 20a, and performing almost the same action.

Over the embedded type uppermost-layer wiring layer M9, there is a pad layer interlayer insulation film 9. Over the top surface (and the through hole), as parts of the non-embedded type aluminum-based pad metal layer AP, there are arranged an occupancy ratio-regulating dummy pattern 28, aluminum-based bonding pads 6, an aluminum-based seal ring 20a, and the like. Over the pad layer interlayer insulation film 9, and the like, a final passivation film 11 is formed. Over each aluminum-based bonding pad 6, a pad opening 7 is arranged.

Then, an enlarged plan view of the Vss ring cut-out region of FIG. 4-is shown in FIG. 6 (herein, the Vss ring 36g will be specifically described, and precisely the same also applies to the Vdd ring 36d). As shown in FIG. 6, in the Vss ring 36g, there are arranged, for example, slits 37 each having a given length and width, and spaced nearly equidistantly. This is for preventing dishing upon a treatment by metal CMP (Chemical Mechanical Polishing) or the like. As the width and the length of the slit 37, for example, about 1 micrometer and about 20 to 30 micrometers can be exemplified, respectively, as preferable examples. In this example, the width of the Vss ring 36g is set as about 20 micrometers as one example. Herein, the example of the slit 37 having given length and width was shown. However, any slit shape and dimensions are acceptable so long as they form a shape not inhibiting the flow of a current along the ring. A given periodicity is not particularly required to occur. However, from the viewpoint of preventing dishing, it is natural for the slits to necessarily have a periodicity in the width direction.

Then, the A-B cross section of FIG. 6 is shown in FIG. 7 with the upper layer included therein. As shown in FIG. 7, in this cross section, the Vss ring 36g is divided into a large number of parts in the width direction. Further, the part present at a layer thereover is the occupancy ratio-regulating dummy pattern 28.

3. Explanation of essential part device structure and the like in the semiconductor integrated circuit device of the one embodiment of the present application (mainly FIGS. 8 to 10)

Figure 8:
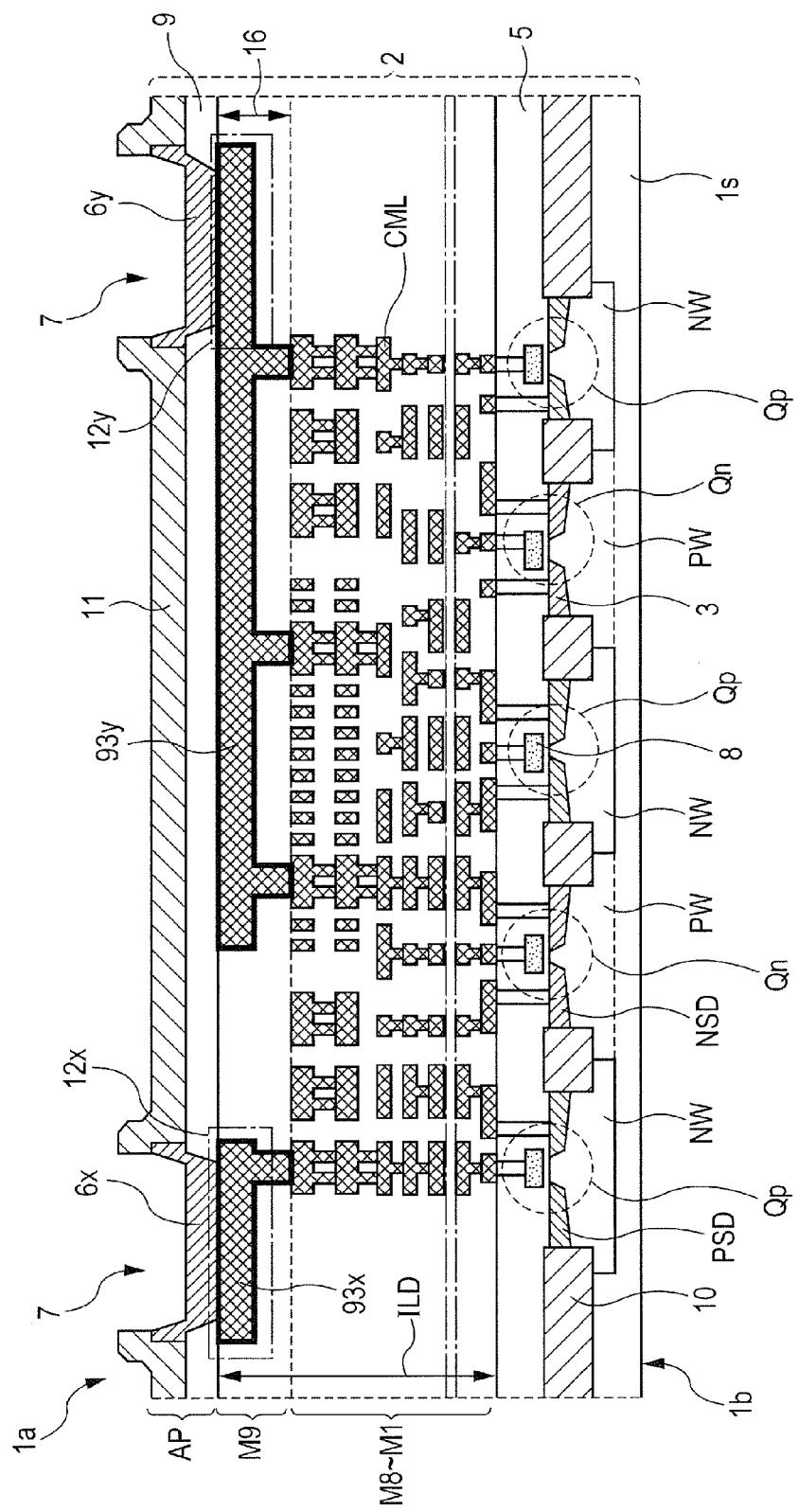
FIG. 8 is a device schematic cross-sectional view for illustrating the essential part device structure and the like in the semiconductor integrated circuit device of the one embodiment of the present application.

In this section, the structure and the like of the semiconductor integrated circuit device of the one embodiment of the present application will be described with emphasis on the essential part device structure. Herein, generally, the underlayer metal pad is, for example, as shown in FIG. 8, coupled to the underlying-layer wiring through a via immediately thereunder, or is coupled to the underlying-layer wiring and the like through the same-layer wiring integral therewith. However, in FIGS. 9 and 10 (also similarly in FIGS. 19 and 20), graphical expression is complicated, and hence, the vias and the same-layer wiring integral therewith are not shown.

Incidentally, herein, a specific description will be given by taking a device having a CMOS (Complementary Metal Oxide Semiconductor) type circuit configuration formed over a P type single crystal silicon substrate as an example. However, it is naturally understood that devices formed over other substrates or devices of other circuit configurations formed over the same substrate are also acceptable.

Figure 9:
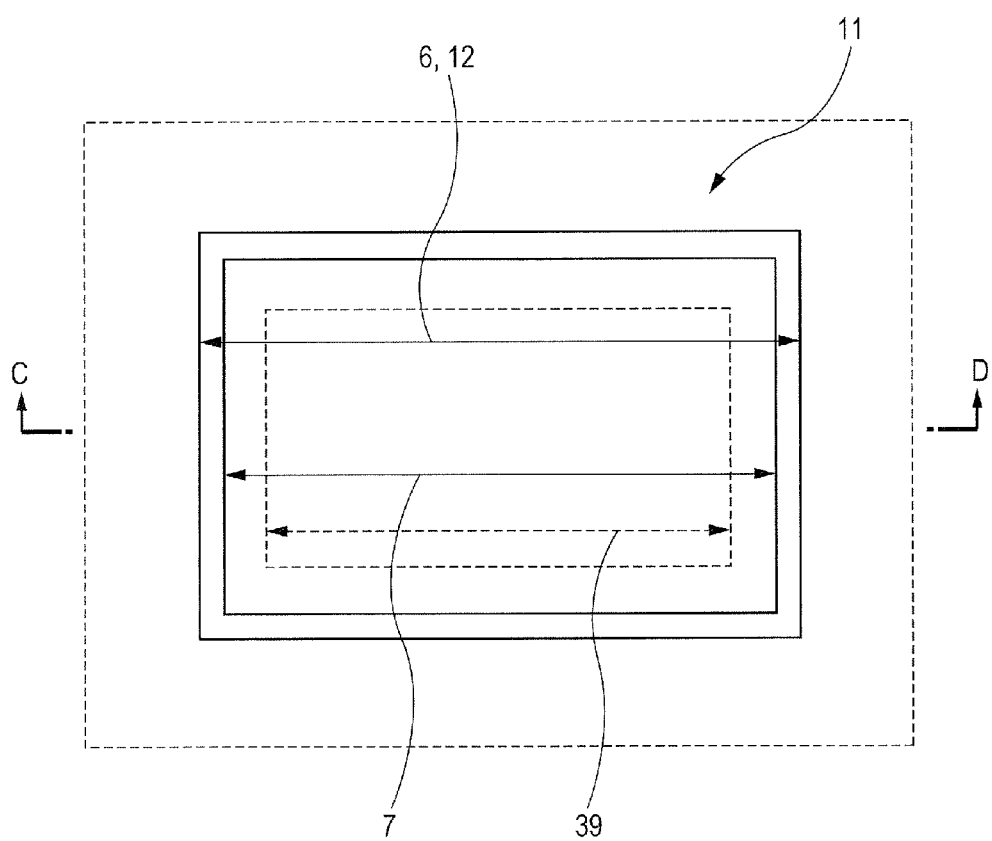
FIG. 9 is a pad periphery expanded top view roughly corresponding to an aluminum-based main bonding pad film 6x or 6y of FIG. 8.
Figure 10:
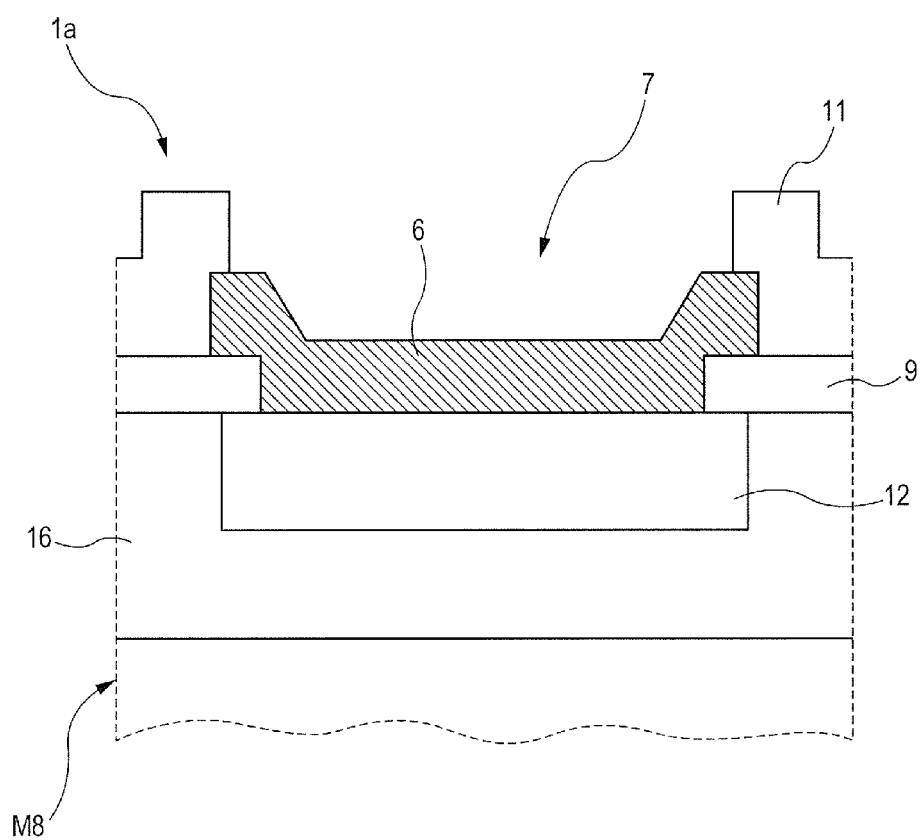
FIG. 10 is a device schematic cross-sectional view of the C-D cross section of FIG. 9.

FIG. 8 is a device schematic cross-sectional view for illustrating the essential part device structure and the like in the semiconductor integrated circuit device of the one embodiment of the present application. FIG. 9 is a pad periphery expanded top view roughly corresponding to aluminum-based main bonding pad films 6x and 6y of FIG. 8. FIG. 10 is a device schematic cross-sectional view of the C-D cross section of FIG. 9. Based on these, a description will be given to the essential part device structure and the like in the semiconductor integrated circuit device of the one embodiment of the present application.

First, a more specific form of the wiring structure and the like described in conjunction with FIGS. 1 and 2 will be described by reference to FIG. 8. As shown in FIG. 8, on the device surface 1a (first main surface) side of the P type single crystal silicon substrate part 1s, there are arranged N type well regions NW and P type well regions PW. These and an element isolation field insulation film 10 arranged in the surface region of the P type single crystal silicon substrate part is define together the semiconductor region in which active elements such as MISFETs (Qn and Qp) are formed. In the semiconductor surface region of each N type well region NW, there is arranged a P type source drain region PSD. In the semiconductor surface region of each P type well region PW, there is arranged an N type source drain region NSD. Further, over the semiconductor surface of the substrate part is including each source drain region NSD or PSD arranged therein, a gate electrode 8 is formed via, for example, a gate insulation film. Incidentally, the actual source drain structure, gate electrode and peripheral structure thereof are more complicated. However, herein, the detailed structure will not be described.

Over the surface of the P type single crystal silicon substrate part 1s, a premetal interlayer insulation film 5 is arranged in such a manner as to cover the gate electrodes 8. Tungsten plugs 3 are embedded therein. Over the premetal interlayer insulation film 5, there are arranged copper embedded wirings of from the embedded type first wiring layer M1 to the embedded type eighth wiring layer M8 (intermediate-layer and lower-layer copper embedded wirings CML). The embedded type first wiring layer M1 is formed by, for example, a single damascene method. The embedded type second wiring layer M2 to the embedded type eighth wiring layer M8 are formed by, for example, a dual damascene method.

Over the embedded type eighth wiring layer M8, there is arranged an embedded type uppermost-layer wiring layer M9 (e.g., a copper-based embedded wiring by a dual damascene method) embedded in the embedded wiring uppermost-layer interlayer insulation film 16 (global wiring layer interlayer insulation film). As parts of the embedded type uppermost-layer wiring layer M9, there are arranged an uppermost-layer copper embedded wiring and the like 93x (such as a wiring and a via) as an underlayer metal pad 12x, and an uppermost-layer copper embedded wiring and the like (such as a wiring and a via) 93y with a part thereof as an underlayer metal pad 12y. Herein, the interlayer insulation film of from the embedded type first wiring layer M1 to the embedded type uppermost-layer wiring layer M9 is referred to as an embedded type multilayer wiring layer interlayer insulation film ILD as a whole.

Over the embedded wiring uppermost-layer interlayer insulation film 16, there is arranged a non-embedded type aluminum-based pad metal layer AP. The non-embedded type aluminum-based pad metal layer AP has a lower-layer pad layer interlayer insulation film 9, aluminum-based bonding pads 6x (e.g., signal pads), aluminum-based bonding pads 6y (e.g., power source pads or grounding pads) each formed in a through hole opened in the pad layer interlayer insulation film 9 and in the periphery thereof, and the like. Then, at the uppermost part of the chip 2, there is arranged the final passivation film 11. In portions of the final passivation film 11 lying over respective aluminum-based bonding pads 6x and 6y, there are arranged pad openings 7, respectively. Incidentally, over the final passivation film 11, there may be further formed a resin layer (e.g., in the case of a resin-sealed package) and a rewiring layer (e.g., in the case of a wafer level package).

In this example, respective aluminum-based bonding pads 6x and 6y are directly coupled with the underlayer metal pads 12x and 12y, respectively, without intermediate coupling members such as tungsten plugs interposed therebetween. Incidentally, coupling can also be established via tungsten plugs or the like therebetween. However, when coupling is established not via tungsten plugs or the like therebetween, the structure becomes that much more simplified.

Then, the detailed structure of the aluminum-based bonding pads 6 (6x and 6y) will be described by reference to FIGS. 9 and 10. As shown in FIGS. 9 and 10, in this example, the aluminum-based bonding pads 6 roughly coincide in center with the underlayer metal pads 12 (12x and 12y), and are also roughly equal in shape and dimensions thereto. Incidentally, this configuration is not necessarily required. However, this configuration provides merits of enabling an increase in structural strength without increasing the chip area, and other merits. Herein, the position of the periphery of each pad opening 7 is desirably set slightly inwardly from the periphery of the aluminum-based bonding pad 6. Further, the position of the periphery of each pad contact through hole 39 is desirably set slightly inwardly from the position of the periphery of each pad opening 7 (the position of the periphery of the pad contact through hole 39 can be set at roughly the same position as the position of the periphery of the pad opening 7).

Incidentally, for FIGS. 9 and 10, one example of the dimensions of the main portion will be shown as follows. Namely, the thickness of the aluminum-based bonding pad 6 is, for example, about 1000 nm; the thickness of the underlayer metal pad 12 is, for example, about 900 nm; the planar dimensions of the aluminum-based bonding pad 6 are, for example, about 60×100 micrometers; the planar dimensions of the pad opening 7 are, for example, about 50×90 micrometers; and the planar dimensions of the through hole 39 are, for example, about 40×80 micrometers.

4. Explanation of wafer process and the like in the semiconductor integrated circuit device of the one embodiment of the present application (mainly FIGS. 11 to 18)

In this section, one example of the manufacturing method for the main device structures of Sections 1 to 3 will be shown. However, it is naturally understood that the structures can also be formed by other manufacturing methods than those described below.

Figure 11:
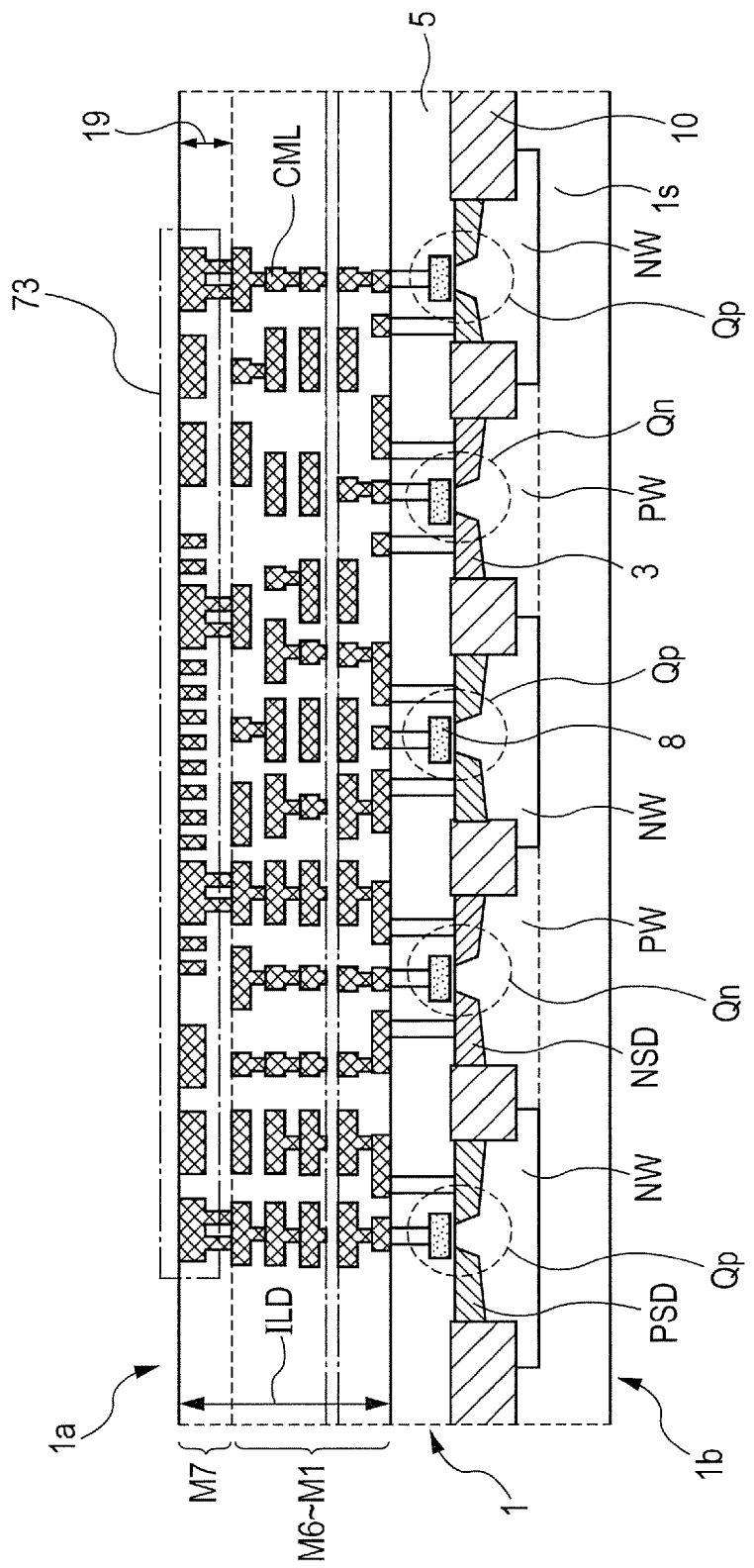
FIG. 11 is a device schematic cross-sectional view corresponding to FIG. 8 for illustrating a wafer process and the like in the semiconductor integrated circuit device of the one embodiment of the present application (upon completion of an embedded type seventh wiring layer M7)
Figure 14:
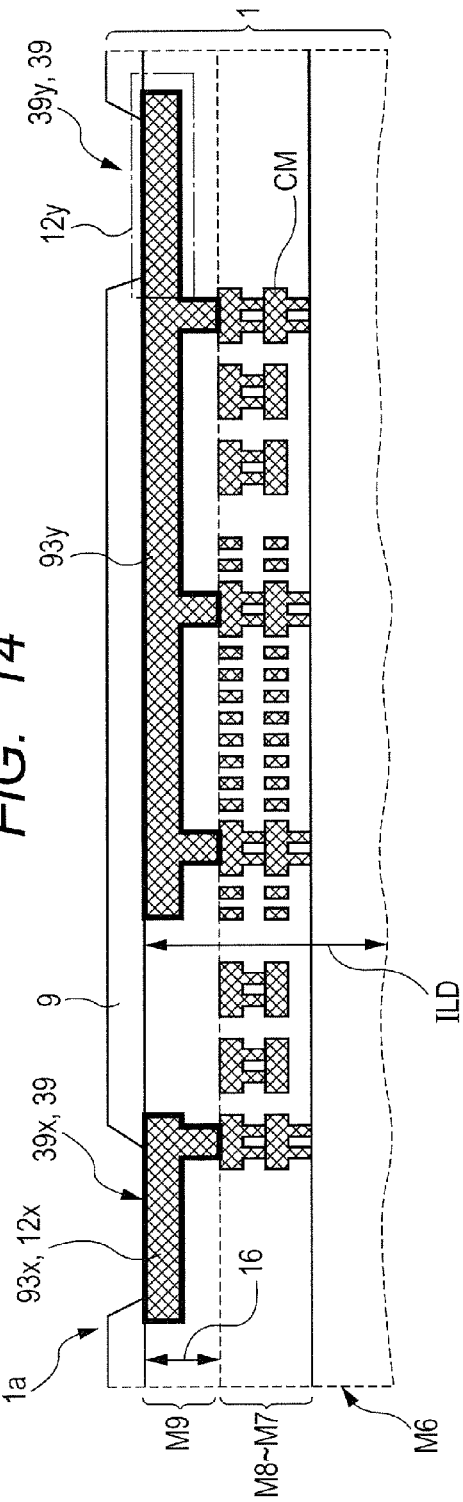
FIG. 14 is a device schematic cross-sectional view corresponding to FIG. 8 for illustrating the wafer process and the like in the semiconductor integrated circuit device of the one embodiment of the present application (upon completion of pad contact through holes 39)
Figure 15:
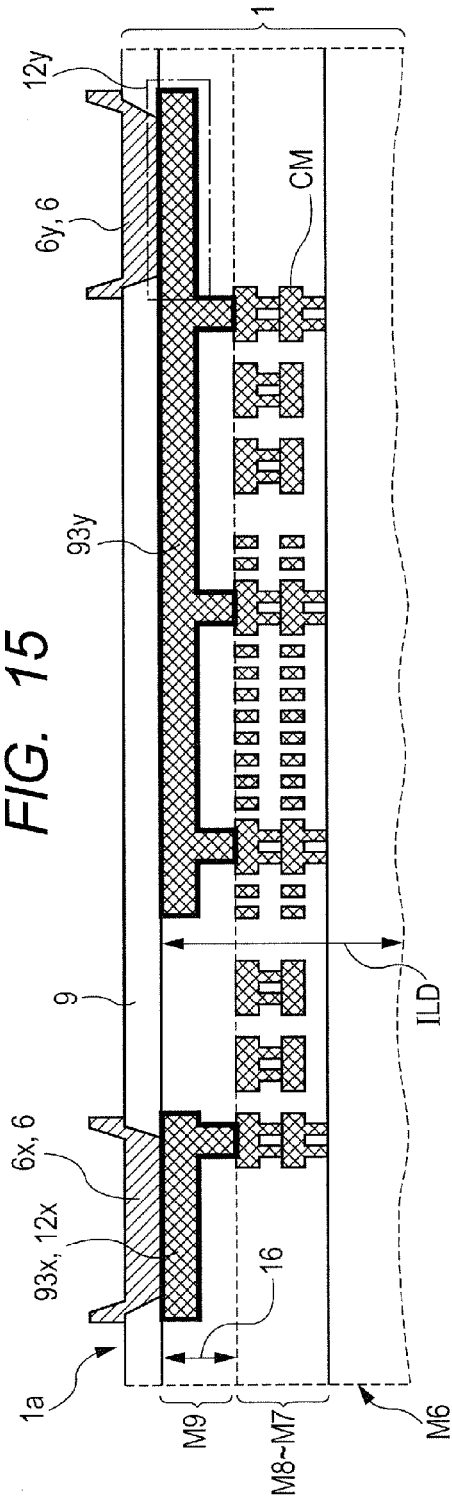
FIG. 15 is a device schematic cross-sectional view corresponding to FIG. 8 for illustrating the wafer process and the like in the semiconductor integrated circuit device of the one embodiment of the present application (upon completion of processing of aluminum-based bonding pads)
Figure 16:
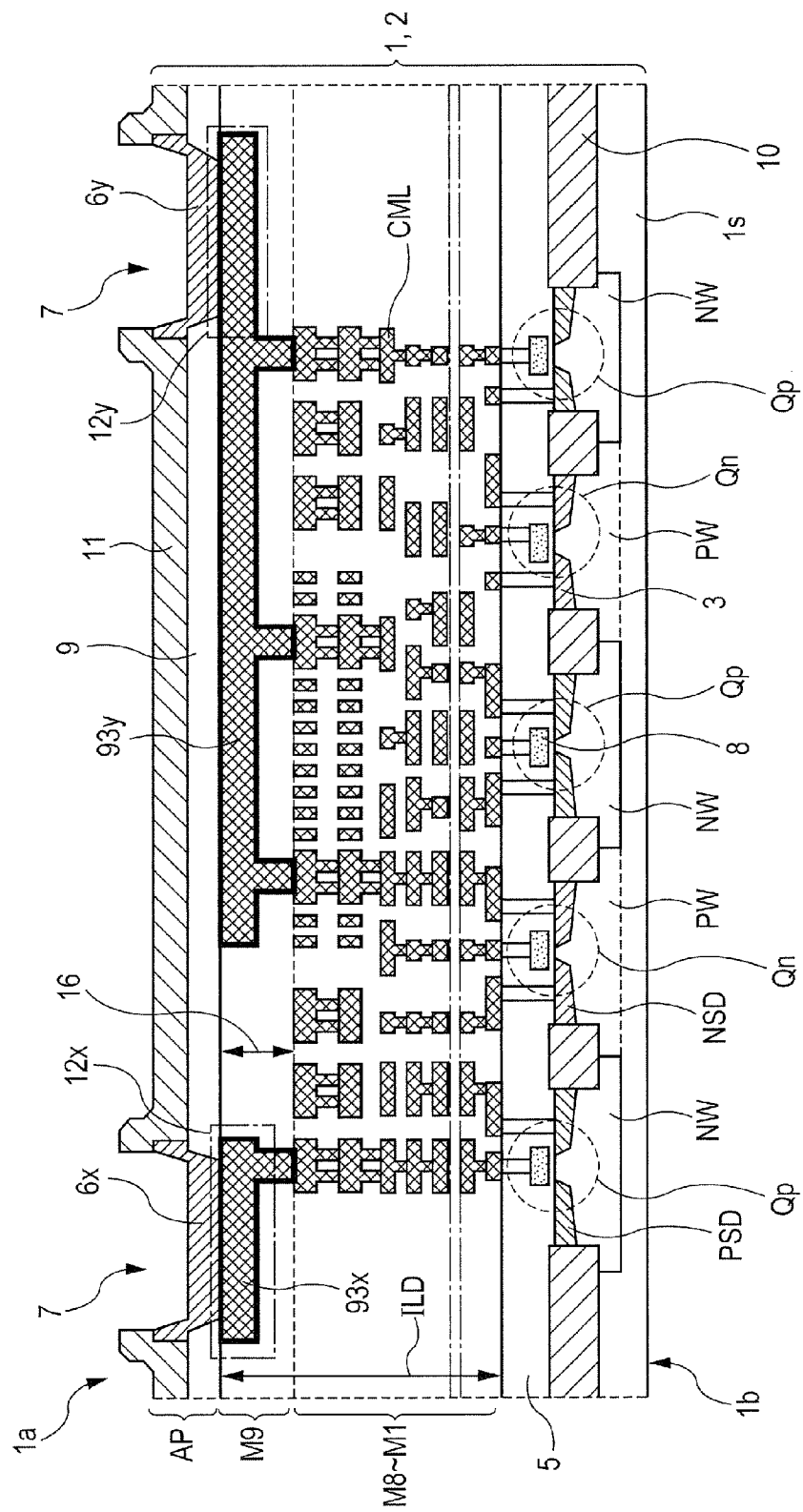
FIG. 16 is a device schematic cross-sectional view corresponding to FIG. 8 for illustrating the wafer process and the like in the semiconductor integrated circuit device of the one embodiment of the present application (upon completion of pad opening processing of a final passivation film)
Figure 17:
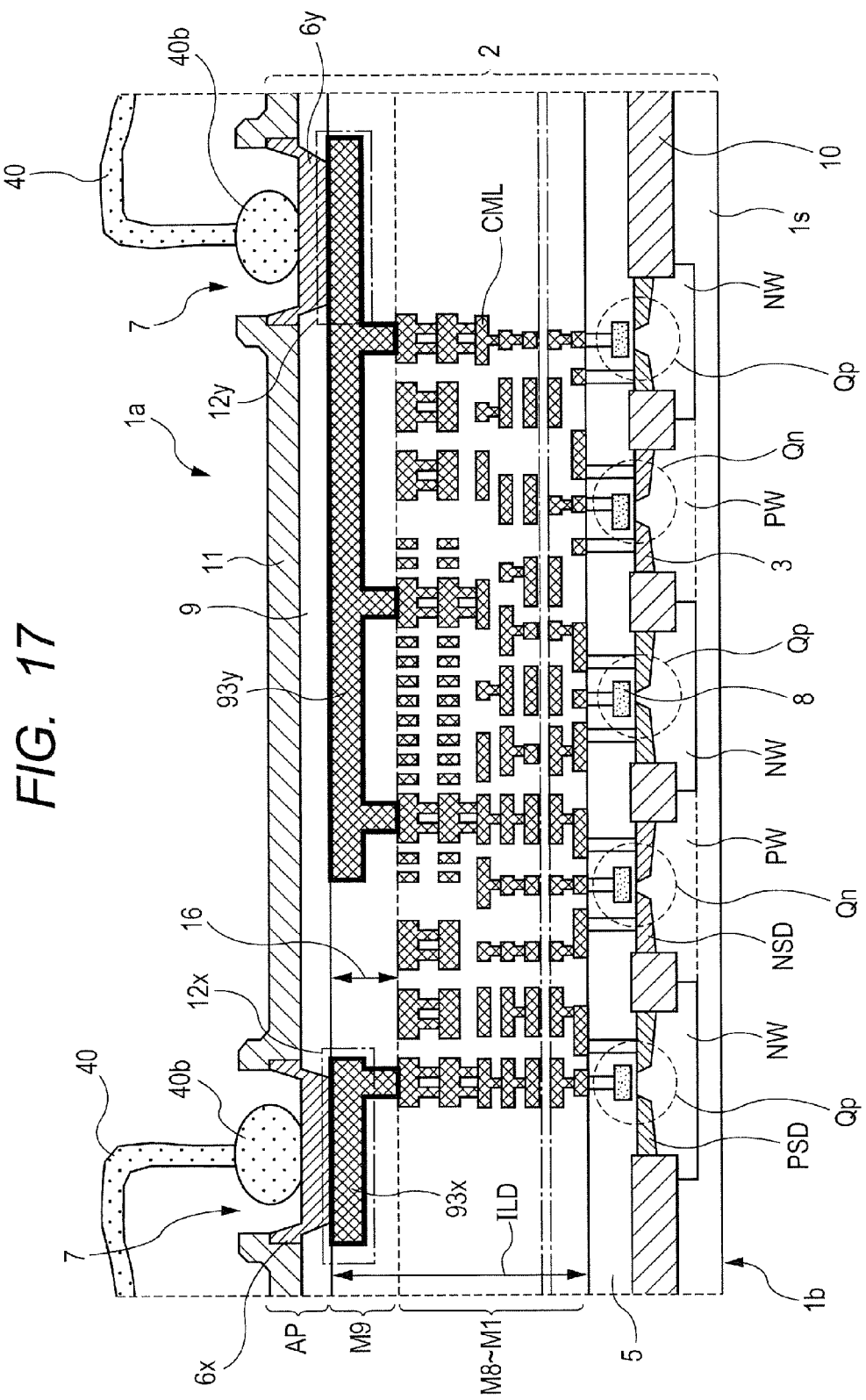
FIG. 17 is a device schematic cross-sectional view corresponding to FIG. 8 for illustrating the wafer process and the like in the semiconductor integrated circuit device of the one embodiment of the present application (upon completion of wire bonding)
Figure 18:
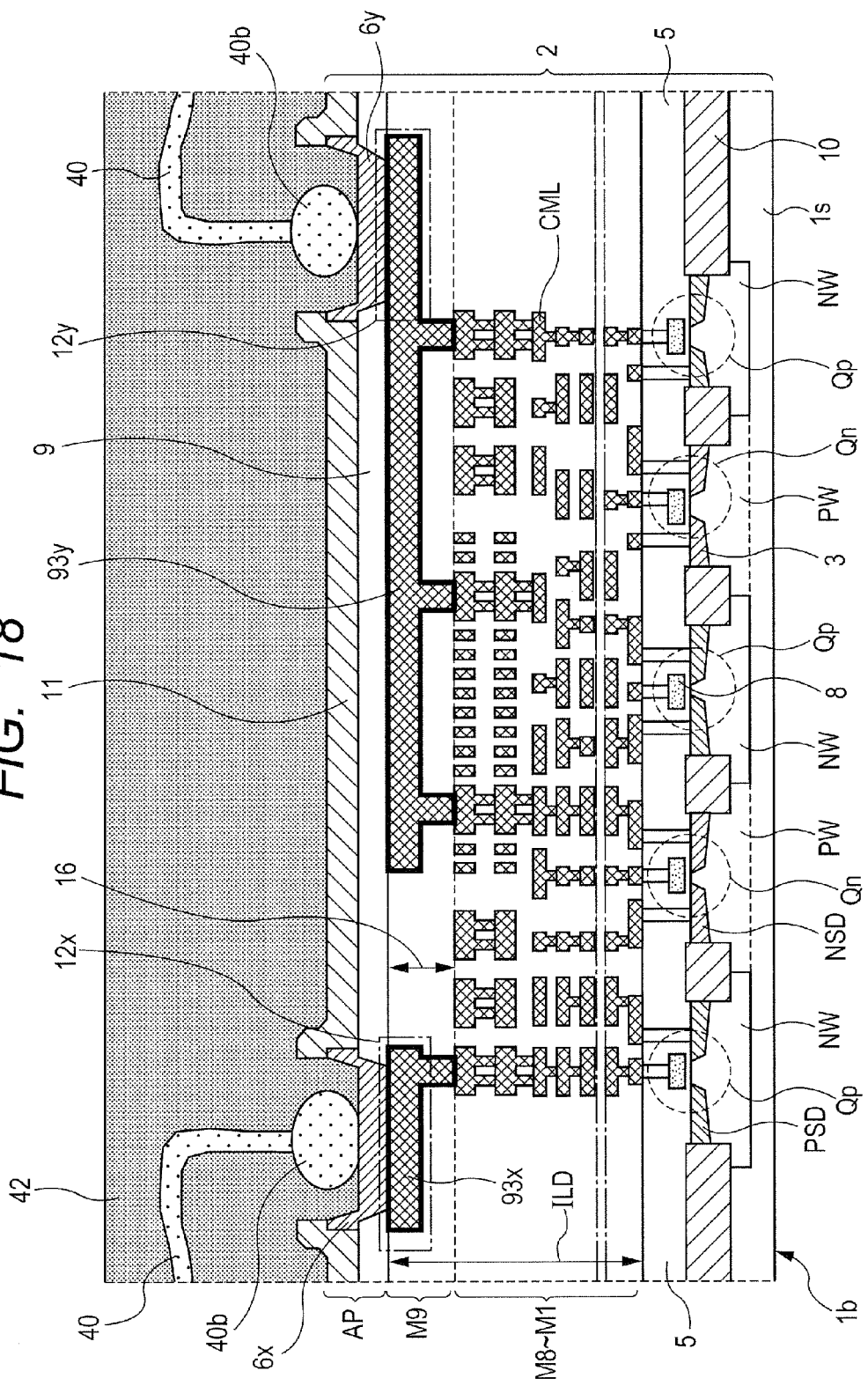
FIG. 18 is a device schematic cross-sectional view corresponding to FIG. 8 for illustrating the wafer process and the like in the semiconductor integrated circuit device of the one embodiment of the present application (upon completion of a resin mold)

FIG. 11 is a device schematic cross-sectional view corresponding to FIG. 8 for illustrating a wafer process and the like in the semiconductor integrated circuit device of the one embodiment of the present application (upon completion of the embedded type seventh wiring layer M7). FIG. 12 is a device schematic cross-sectional view corresponding to FIG. 8 for illustrating the wafer process and the like in the semiconductor integrated circuit device of the one embodiment of the present application (upon completion of the embedded type eighth wiring layer M8). FIG. 13 is a device schematic cross-sectional view corresponding to FIG. 8 for illustrating the wafer process and the like in the semiconductor integrated circuit device of the one embodiment of the present application (upon completion of the embedded type uppermost-layer wiring layer M9). FIG. 14 is a device schematic cross-sectional view corresponding to FIG. 8 for illustrating the wafer process and the like in the semiconductor integrated circuit device of the one embodiment of the present application (upon completion of the pad contact through hole 39). FIG. 15 is a device schematic cross-sectional view corresponding to FIG. 8 for illustrating the wafer process and the like in the semiconductor integrated circuit device of the one embodiment of the present application (upon completion of processing of the aluminum-based bonding pads). FIG. 16 is a device schematic cross-sectional view corresponding to FIG. 8 for illustrating, the wafer process and the like in the semiconductor integrated circuit device of the one embodiment of the present application (upon completion of processing of the pad openings of the final passivation film). FIG. 17 is a device schematic cross-sectional view corresponding to FIG. 8 for illustrating the wafer process and the like in the semiconductor integrated circuit device of the one embodiment of the present application (upon completion of wire bonding). FIG. 18 is a device schematic cross-sectional view corresponding to FIG. 8 for illustrating the wafer process and the like in the semiconductor integrated circuit device of the one embodiment of the present application (upon completion of the resin mold). Based on these, a description will be given to the wafer process and the like in the semiconductor integrated circuit device of the one embodiment of the present application.

The BEOL step for up to the embedded type sixth wiring layer M6 is the same as the known damascene step. Therefore, the steps from that for the embedded type seventh wiring layer M7 will be described by reference to FIG. 11. As shown in FIG. 11, on the device surface 1a (first main surface) side of the wafer 1, over the embedded type first wiring layer M1 to the embedded type sixth wiring layer M6 having lower-layer copper embedded wirings and the like CL (such as wirings and vias), there is formed a semi-global lower-layer wiring layer interlayer insulation film 19 by, for example, CVD (Chemical Vapor Deposition). Then, by general lithography, wiring trenches and vias are opened. Therein, a tantalum nitride film is deposited by, for example, reactive sputtering deposition. Subsequently, a copper seed film is formed by, for example, sputtering deposition. Subsequently, a copper film is filled by, for example, electrolytic plating. Then, the portions of the tantalum nitride film and the copper film outside the wiring trenches and vias are removed by, for example, CMP, thereby to form a seventh-layer copper embedded wiring 73.

Then, as shown in FIG. 12, over the semi-global lower-layer wiring layer interlayer insulation film 19, a semi-global upper-layer wiring layer interlayer insulation film 18 is formed by, for example, CVD. Then, for example, by general lithography, wiring trenches and vias are opened. Therein, a tantalum nitride film is deposited by, for example, reactive sputtering deposition. Subsequently, a copper seed film is formed by, for example, sputtering deposition. Subsequently, a copper film is filled by, for example, electrolytic plating. Then, the portions of the tantalum nitride film and the copper film outside the wiring trenches and vias are removed by, for example, CMP, thereby to form an eighth-layer copper embedded wiring 83.

Then, as shown in FIG. 13, over the embedded type seventh wiring layer M7 and the embedded type eighth wiring layer M8 having interlayer-layer copper embedded wirings and the like CM (such as wirings and vias), an embedded wiring uppermost-layer interlayer insulation film 16 (global wiring layer interlayer insulation film) is formed by, for example, CVD. Then, by, for example, general lithography, wiring trenches and vias are opened. Therein, a tantalum nitride film is deposited by, for example, reactive sputtering deposition. Subsequently, a copper seed film is formed by, for example, sputtering deposition. Subsequently, a copper film is filled by, for example, electrolytic plating. Then, the portions of the tantalum nitride film and the copper film outside the wiring trenches and vias are removed by, for example, CMP, thereby to form an uppermost-layer copper embedded wiring and the like 93 (such as wirings and vias).

Then, as shown in FIG. 14, over the embedded wiring uppermost-layer interlayer insulation film 16 (global wiring layer interlayer insulation film), a pad layer interlayer insulation film 9 is deposited by, for example, CVD. By, for example, general lithography, pad contact through holes 39 (39x and 39y) are opened over the underlayer metal pads 12x and 12y, respectively.

Then, as shown in FIG. 15, almost entirely over the top surface of the pad layer interlayer insulation film 9 including the pad contact through holes 39 (39x and 39y), a TiN film is deposited by, for example, reactive sputtering deposition. Subsequently, an aluminum-based metal film (a metal film including aluminum as a main component) is formed by, for example, sputtering deposition. The composite film is patterned by, for example, dry etching with a resist film formed by, for example, general lithography as a mask, thereby to form aluminum-based bonding pads 6 (6x and 6y).

Then, as shown in FIG. 16, almost entirely over the pad layer interlayer insulation film 9 and the aluminum-based bonding pads 6 (6x and 6y), a final passivation film 11 is deposited by, for example, CVD. Then, pad openings 7 are opened by, for example, general lithography.

Thereafter, if required, back grinding and a probe test are carried out. Then, the wafer 1 is divided into individual chips 2 by dicing or the like.

Then, the individual chips 2 are processed as shown in FIG. 17 and subsequent figures. Namely, as shown in FIG. 17, each aluminum-based bonding pad 6x or 6y and an external lead or the like are intercoupled using a gold wire (bonding wire 40) or the like by, for example, ball & wedge bonding. At this step, generally, the side of the aluminum-based bonding pad 6x or 6y is subjected to ball bonding (bonding by formation of a bonding ball 40b). However, not limited to this, if required, the side of the aluminum-based bonding pad 6x or 6y may be subjected to wedge bonding.

Then, as shown in FIG. 18, a sealing resin layer 42 is formed over the surface 1a of the chip 2 (if required, the whole chip 2 may be sealed) by, for example, transfer molding using an epoxy type sealing resin in such a manner as to cover the final passivation film 11, respective aluminum-based bonding pads 6x and 6y, the bonding wires 40, and the like.

5. Explanation of modified example of pad periphery structure in essential part device structure and the like in the semiconductor integrated circuit device of the one embodiment of the present application (mainly, FIGS. 19 and 20)

In this section, there will be shown one example of the modified example of the pad periphery structure (referred to as "single through hole coupling") described in Section 3 (FIGS. 9 and 10). The system of this section is referred to as "through hole ring coupling".

Figure 19:
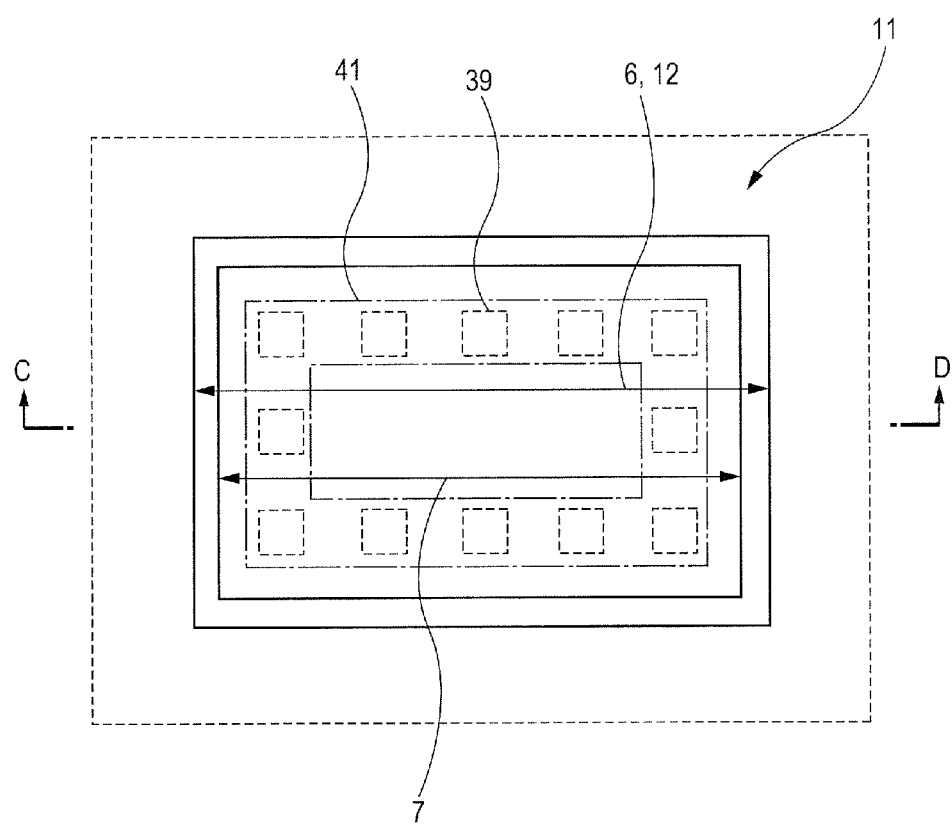
FIG. 19 is a pad periphery expanded top view corresponding to FIG. 9 for illustrating a modified example of a pad periphery structure in an essential-part device structure and the like in the semiconductor integrated circuit device of the one embodiment of the present application.
Figure 20:
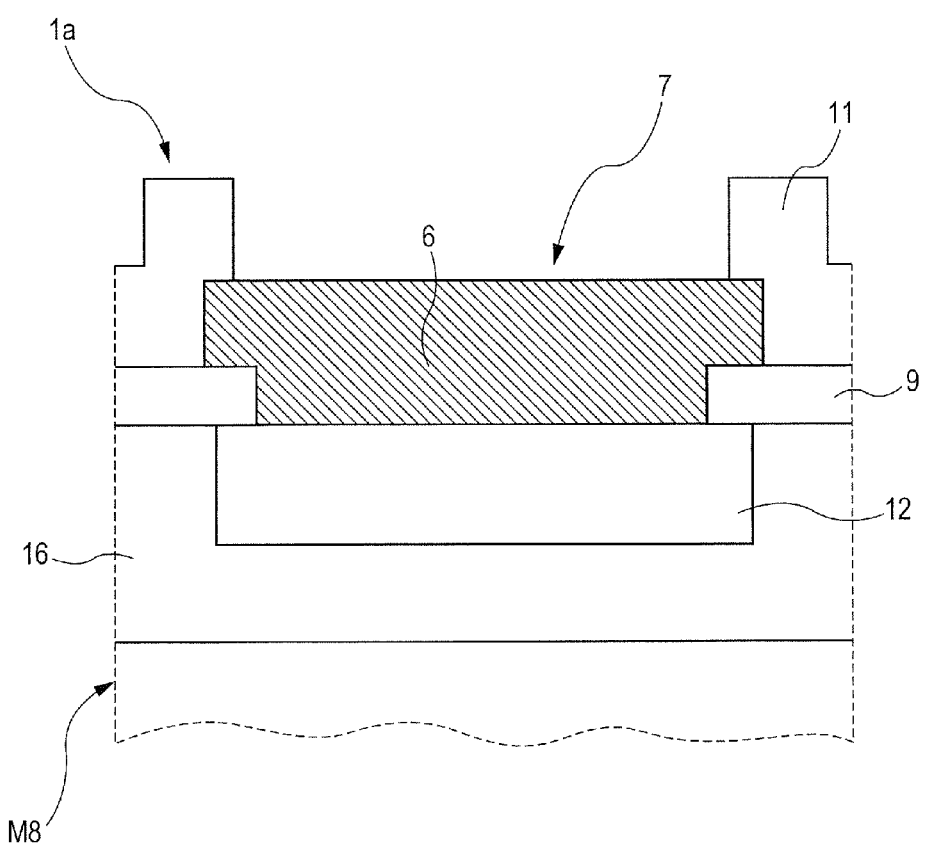
FIG. 20 is a device schematic cross-sectional view of the C-D cross section of FIG. 19.

FIG. 19 is a pad periphery expanded top view corresponding to FIG. 9 for illustrating a modified example of the pad periphery structure in an essential-part device structure and the like in the semiconductor integrated circuit device of the one embodiment of the present application. FIG. 20 is a device schematic cross-sectional view of the C-D cross section of FIG. 19. Based on these, a description will be given to the modified example of the pad periphery structure in the essential part device structure and the like in the semiconductor integrated circuit device of the one embodiment of the present application.

As shown in FIGS. 19 and 20, with through hole ring coupling, the aluminum-based bonding pads 6 and the underlayer metal pads 12 are intercoupled via a through hole ring 41 including a large number of pad contact through holes 39.

As individual dimensions of the pad contact through holes 39, for example, about, 3×3 micrometers can be shown as one example of preferable ones. Other dimensions are roughly the same as those shown for the single through hole coupling. Herein, the dimensions of the periphery of the through hole ring 41 may be desirably set to correspond to those of the periphery of the single through hole 39 for single through hole coupling.

Herein, the single through hole coupling and the through hole ring coupling will be compared with each other as follows. Namely, with the single through hole coupling, the bonding pad is in a basin form, and hence the probe characteristics are favorable. However, the flat portion is narrow, and hence the wire bonding characteristics are relatively inferior. On the other hand, with the through hole ring coupling, the flat portion is wide, and hence the wire bonding characteristics are relatively favorable. However, the probe characteristics are relative inferior.

6. Explanation of modified example and the like of aluminum-based same-layer metal comb-shaped MIM capacitor and occupancy ratio-regulating dummy pattern (mainly, FIG. 21)

In this section, one modified example of the occupancy ratio-regulating dummy pattern shown in FIG. 3 will be described, and the possibility of using this as a MIM capacitor will be described. Namely, the occupancy ratio-regulating dummy pattern is not limited to those shown in FIGS. 3 and 21, and is variously changeable so long as it can evenly achieve a given occupancy ratio. Further, use as another element is not limited to use as a capacitor, and the dummy pattern can also be used as an inductance, an antenna, a resistance element, or the like.

Figure 21:
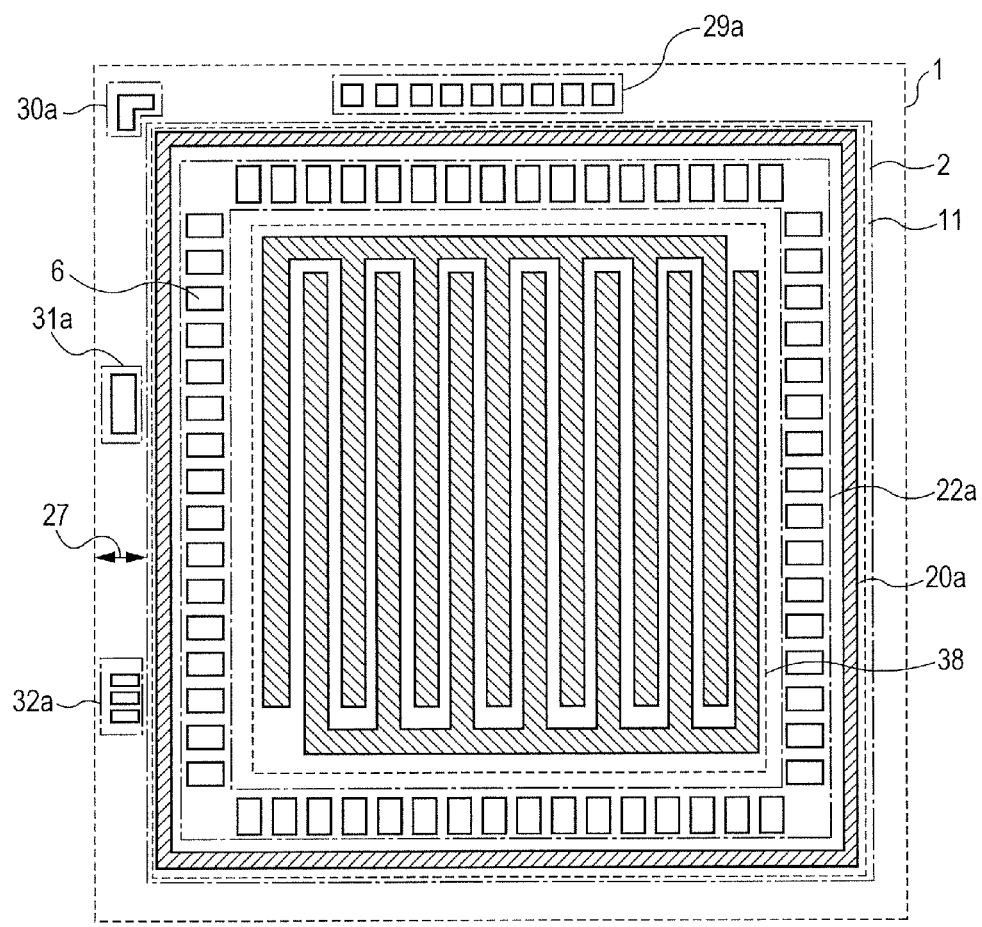
FIG. 21 is a schematic layout view of a chip region and its periphery corresponding to FIG. 3 for illustrating a modified example and the like of an aluminum-based same-layer metal comb-shaped MIM capacitor and an occupancy ratio-regulating dummy pattern (shown with emphasis on the non-embedded type aluminum-based pad metal layer)

FIG. 21 is a schematic layout view of a chip region and its periphery corresponding to FIG. 3 for illustrating a modified example and the like of an aluminum-based same-layer metal comb-shaped MIM capacitor and an occupancy ratio-regulating dummy pattern (shown with emphasis on the non-embedded type aluminum-based pad metal layer). Based on this, a description will be given to the modified example and the like of the aluminum-based same-layer metal comb-shaped MIM capacitor and the occupancy ratio-regulating dummy pattern.

FIG. 21 is a modified example of the planar layout of the non-embedded type aluminum-based pad metal layer AP corresponding to FIG. 3. The difference from FIG. 3 is as follows: the part of the dot-like occupancy ratio-regulating dummy pattern 28 in FIG. 3 is formed as the same-layer metal comb-shaped MIM capacitor 39 (a pair of same-layer metal capacitor electrodes) in FIG. 21. Incidentally, this pattern can also be used as a linear occupancy ratio-regulating dummy pattern not as the same-layer metal comb-shaped MIM capacitor 39. Alternatively, the pattern is a pair of same-layer metal capacitor electrodes of the same-layer metal comb-shaped MIM capacitor, and at the same time, can also be used as a linear occupancy ratio-regulating dummy pattern.

7. Preliminary explanation and general consideration regarding the respective embodiments and the like (including modified examples)

In this section, a preliminary explanation and a general consideration will be given to the respective embodiments (including modified examples).

Figure 22:
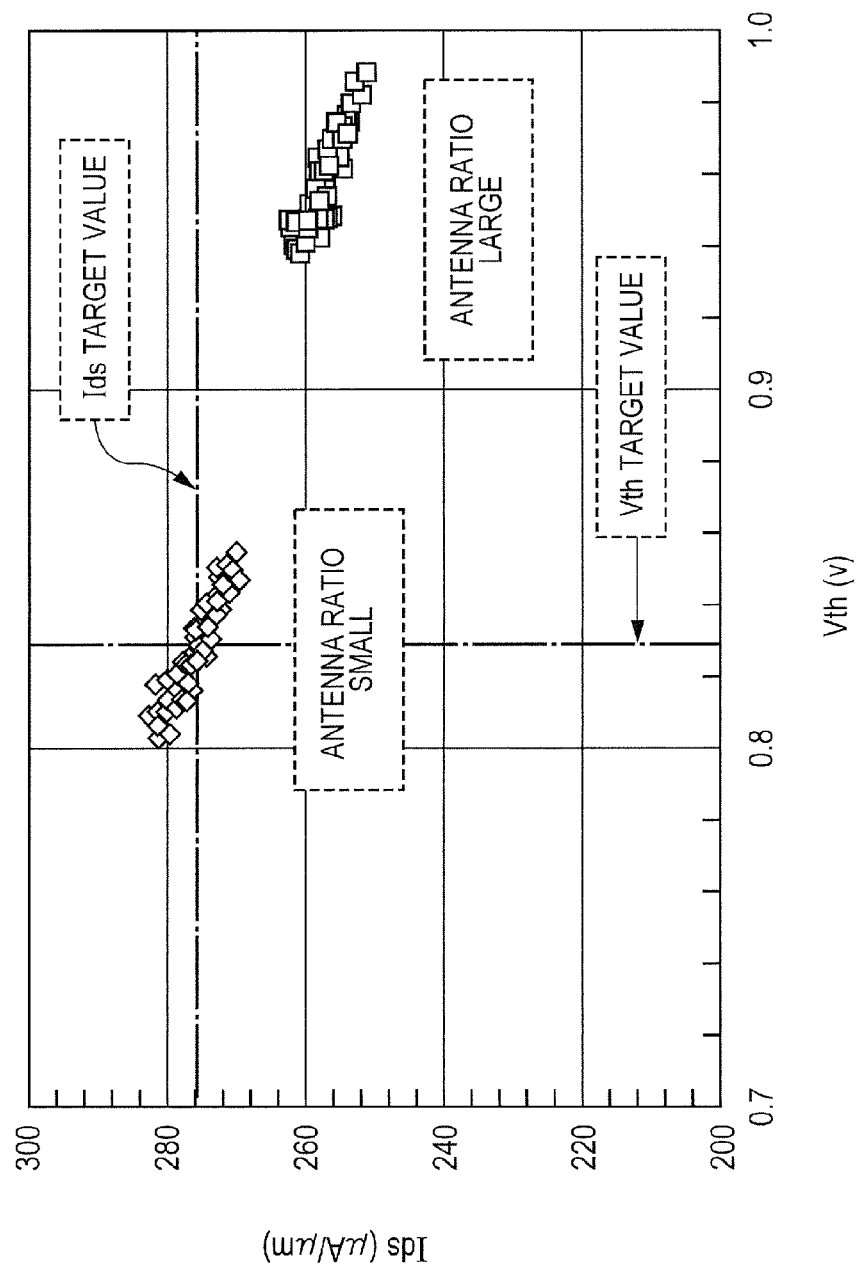
FIG. 22 is a data plot showing the distribution of the source-drain currents and the threshold voltages of MISFETs for samples subjected to a plasma treatment with respect to wafers with a large antenna ratio and wafers with a small antenna ratio.

FIG. 22 is a data plot showing the distribution of the source-drain currents (Ids) and the threshold voltages (Vth) of MISFETs for samples subjected to a plasma treatment with respect to wafers with a large antenna ratio and wafers with a small antenna ratio. This shows the results of measurements at room temperature for N channel type MOSFETs with a gate oxide film thickness of about 7.5 nm. The source-drain current is the value when both of the drain voltage and the gate voltage are 3.3 V.

The non-embedded type aluminum-based pad metal layer AP (FIG. 3) generally often includes wiring patterns (or, simply "wirings") such as power source wirings and signal wirings together with non-wiring patterns such as pads. This responds to a general requirement of enhancing the utilization of each wiring layer. However, a study by the present inventors indicates as follows: the non-embedded type aluminum-based pad metal layer AP which is the uppermost-layer metal layer is generally processed by dry etching, and hence is unfavorably susceptible to plasma damages. Particularly, at this stage in a state in which all wirings are coupled, the presence of wiring patterns of power source wirings, signal wirings, and the like which generally tend to be increased in antenna ratio, and tend to include those coupled to the semiconductor substrate and the elements (active elements such as MISFETs, and the like) may cause deterioration of the reliability and performances of the device. This tendency is particularly remarkable for a signal wiring having a high possibility of being directly coupled to a terminal of an active element such as a MISFET. Further, the power source wiring tends to be particularly increased in antenna ratio. The foregoing points can be understood by reference to, for example, FIG. 22. Namely, it is indicated as follows: with wafers having an intra-chip wiring layout relatively smaller in antenna ratio, plots are distributed in the vicinity of the point of intersection between linear lines indicative of the target value of the source-drain current and the target value of the threshold voltage; however, with wafers having an intra-chip wiring layout relatively larger in antenna ratio, the plots are shifted to the lower side with respect to the source-drain current, and are shifted to the higher side with respect to the threshold voltage.

Alternatively, with a general design technique ("general design technique"), power supply rings (power supply trunk wirings) such as grounding rings, Vss rings, and Vcc rings are arranged as parts of the uppermost-layer metal layer. However, disposition of such metal figures having a large area and large dimensions (large in diameter size) is not only detrimental to plasma damages, but also may cause the occurrence of cracks and the like due to the difference in physical characteristics between the metal layer and the final passivation film thereover.

In contrast, in the foregoing embodiments, the uppermost-layer metal layer (the uppermost-layer non-embedded metal layer) is used only for the non-wiring pattern as much as possible. Thus, signal wirings which tend to have a larger antenna ratio, power supply rings (power supply trunk wirings) which tend to be increased in antenna ratio, width (area), or the like, and other power source wirings are shifted to the immediately underlying layer, namely, the uppermost-layer embedded wiring layer in the embedded wiring. It is naturally understood that all wirings are shifted to the lower layer. However, some wirings with a relatively smaller antenna ratio can be left at the uppermost-layer non-embedded metal layer (this also applied to the following).

Alternatively, it is also effective that the power supply rings (power supply trunk wirings) and the signal wirings of the wirings belonging to the uppermost-layer non-embedded metal layer in the general design technique are shifted to the lower layer. In this case, the uppermost-layer non-embedded metal layer substantially does not have power supply rings and signal wirings as parts thereof. Incidentally, in this case, it is also effective that substantially all wirings of the wirings belonging to the uppermost-layer non-embedded metal layer in the general design technique are shifted to the lower layer (e.g., uppermost-layer embedded wiring layer). In this case, the uppermost-layer non-embedded metal layer substantially does not have wirings as parts thereof.

Incidentally, it is also effective that mainly the power supply rings (power supply trunk wirings) of the wirings belonging to the uppermost-layer non-embedded metal layer in the general design technique are shifted to the lower layer (e.g., the uppermost-layer embedded wiring layer). In this case, the uppermost-layer non-embedded metal layer substantially does not have power supply ring (power supply ring wirings) as parts thereof.

Further, it is advantageous in layout that the embedded wiring layer to which some portions of the wirings belonging to the uppermost-layer non-embedded metal layer in the general design technique are shifted (referred to as a "destination wiring layer") is set as the uppermost-layer embedded wiring layer in the immediately underlying embedded wiring. However, a shift to other layers (mainly, one layer or two layers of the semi-global wirings) is also possible. It is most preferable that the destination wiring layer is set as the uppermost-layer embedded wiring layer. This is for the following reason: the uppermost-layer embedded wiring layer has a predominantly larger cross-sectional area of wiring than those of other wiring layers, and hence is preferable as an alternative wiring layer of aluminum-based wirings (particularly power source wirings such as power source wiring rings) generally having a large current amount.

Further, it is not essential that the underlayer metal pad is formed of such an uppermost-layer embedded wiring layer having a strong mechanical strength. However, provision thereof can improve the mechanical strength of the aluminum-based main bonding pad film and the periphery thereof.

8. Summary

Up to this point, the inventions made by the present inventors were specifically described by way of embodiments. However, the present invention is not limited thereto. It is naturally understood that the present invention can be variously changed within the scope not departing from the gist.

For example, in the foregoing embodiments, mainly, the copper-based embedded wirings were specifically described. However, the present invention is not limited thereto. It is naturally understood that the present invention is also applicable to silver-based embedded wirings and other metal-based embedded wirings.

Further, the barrier metal for copper was specifically described by taking a tantalum nitride type barrier metal as an example. However, the present invention is not limited thereto. It is naturally understood that other barrier metals such as titanium nitride type barrier metals (including a Ti/TiN multilayer barrier) and ruthenium type barrier metals are also acceptable. Whereas, a specific description was given by taking a TaN film monolayer barrier metal as an example. However, the present invention is not limited thereto. It is naturally understood that a Ta/TaN multilayer barrier is also acceptable.

Further, the insulation copper diffusion barrier film was specifically described by mainly taking SiC, SiN, and the like as examples. However, the present invention is not limited thereto. It is naturally understood that films of SiCN, and the like are also acceptable.

What is claimed is:

1. A semiconductor integrated circuit device comprising:
    (a) a semiconductor substrate having a first main surface;
    (b) a plurality of MISFETs arranged over the first main surface of the semiconductor substrate;
    (c) an embedded type multilayer wiring layer arranged over the first main surface of the semiconductor substrate and over the MISFETs;
    (d) a non-embedded type aluminum-based pad metal layer arranged over the embedded type multilayer wiring layer, wherein the non-embedded type aluminum-based pad metal layer does not have a power supply ring wiring;
    (e) a plurality of metal bonding pads arranged as parts of the non-embedded type aluminum-based pad metal layer;
    (f) a final passivation film formed at a layer above the non-embedded type aluminum-based pad metal layer;
    (g) a pad opening arranged in the final passivation film over each of the metal bonding pads; and
    (h) a power supply ring wiring arranged as a part of an embedded type uppermost-layer wiring layer of the embedded type multilayer wiring layer.

2. The semiconductor integrated circuit device according to claim 1, further comprising:
    (i) a dishing preventing slit arranged in the power supply ring wiring.

3. The semiconductor integrated circuit device according to claim 1,
    wherein each of the metal bonding pads is coupled to the embedded type uppermost-layer wiring layer not via a plug.

4. The semiconductor integrated circuit device according to claim 3, further comprising:
    (j) an underlayer metal pad arranged as a part of the embedded type uppermost-layer wiring layer under each of the metal bonding pads, and nearly equal in shape and area to the metal bonding pad thereover.

5. The semiconductor integrated circuit device according to claim 4, further comprising:
    (k) a single through hole arranged between each of the metal bonding pads and the underlayer metal pad thereunder.

6. The semiconductor integrated circuit device according to claim 4, further comprising:
    (k) a plurality of through holes arranged between each of the metal bonding pads and the underlayer metal pad thereunder.

7. The semiconductor integrated circuit device according to claim 5,
    wherein the non-embedded type aluminum-based pad metal layer does not have a wiring.

8. The semiconductor integrated circuit device according to claim 7, further comprising:
    (m) a large number of occupancy ratio-regulating dummy patterns arranged in such a manner as to be almost uniformly distributed as parts of the non-embedded type aluminum-based pad metal layer in the inside region of the first main surface.

9. The semiconductor integrated circuit device according to claim 8, further comprising:
    (n) an aluminum-based seal ring as a part of the non-embedded type aluminum-based pad metal layer along the periphery of the first main surface.

10. The semiconductor integrated circuit device according to claim 9,
    wherein the metal bonding pads are arrayed in a ring form so as to be along the aluminum-based seal ring and in the inside thereof.

11. The semiconductor integrated circuit device according to claim 10, wherein the embedded type multilayer wiring layer is a copper-based embedded type multilayer wiring layer.

12. The semiconductor integrated circuit device according to claim 1,
wherein the non-embedded type aluminum-based pad metal layer does not have a signal wiring.

13. The semiconductor integrated circuit device according to claim 12 further comprising:
(q) a sealing resin layer covering over the final passivation film.

14. The semiconductor integrated circuit device according to claim 1 further comprising:
(p) a bonding wire coupled to the top surface of each of the metal bonding pads.

* * * * *